United States Patent
Hongo et al.

(10) Patent No.: US 7,033,463 B1
(45) Date of Patent: Apr. 25, 2006

(54) SUBSTRATE PLATING METHOD AND APPARATUS

(75) Inventors: Akihisa Hongo, Tokyo (JP); Naoaki Ogure, Tokyo (JP); Hiroaki Inoue, Tokyo (JP); Satoshi Sendai, Tokyo (JP); Tetsuma Ikegami, Tokyo (JP); Koji Mishima, Tokyo (JP); Shuichi Okuyama, Tokyo (JP); Mizuki Nagai, Tokyo (JP); Ryoichi Kimizuka, Tokyo (JP); Megumi Maruyama, Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/762,582

(22) PCT Filed: Aug. 11, 1999

(86) PCT No.: PCT/JP99/04349

§ 371 (c)(1),
(2), (4) Date: Apr. 12, 2001

(87) PCT Pub. No.: WO00/10200

PCT Pub. Date: Feb. 24, 2000

(30) Foreign Application Priority Data

| Aug. 11, 1998 | (JP) | ................................ 10-239490 |
| Feb. 8, 1999 | (JP) | ................................ 11-030230 |
| Aug. 3, 1999 | (JP) | ................................ 11-220363 |

(51) Int. Cl.
*C25D 17/00* (2006.01)

(52) U.S. Cl. .................. 204/198; 204/212; 204/224 R; 204/232; 204/242; 204/273; 204/275.1

(58) Field of Classification Search ................ 204/198, 204/212, 224 R, 232, 242, 273, 275.1; 205/88, 205/98, 122, 123, 125, 148, 157, 183, 184, 205/187, 261, 291; 427/96, 98, 443.1
See application file for complete search history.

(56) References Cited

U.S. PATENT DOCUMENTS

| 3,716,462 | A | | 2/1973 | Jensen ........................ 205/180 |
| 3,776,770 | A | * | 12/1973 | Lando ......................... 438/514 |
| 3,833,486 | A | * | 9/1974 | Nobel et al. ................. 205/291 |
| 3,930,963 | A | | 1/1976 | Polichette et al. .......... 205/126 |
| 4,303,443 | A | * | 12/1981 | Miyazawa et al. ......... 106/1.23 |
| 4,666,735 | A | * | 5/1987 | Hoover et al. .............. 427/510 |
| 4,956,097 | A | * | 9/1990 | Courduvelis ................. 210/718 |
| 5,116,430 | A | | 5/1992 | Hirai et al. .................. 148/518 |
| 5,433,840 | A | * | 7/1995 | Dahms et al. ............... 205/296 |
| 5,437,777 | A | * | 8/1995 | Kishi ...................... 204/224 R |
| 5,849,171 | A | * | 12/1998 | Dahms et al. .............. 205/298 |
| 5,932,077 | A | * | 8/1999 | Reynolds ................. 204/224 R |
| 6,017,437 | A | * | 1/2000 | Ting et al. ..................... 205/80 |

(Continued)

FOREIGN PATENT DOCUMENTS

GB        1222969   A   *   2/1971

(Continued)

*Primary Examiner*—Arun S. Phasge
(74) *Attorney, Agent, or Firm*—Wenderoth, Lind & Ponack, L.L.P.

(57) ABSTRACT

A method and apparatus plate a substrate to form wiring by efficiently filling a fine recess formed in a semiconductor substrate with plating metal without a void or contamination. The plating of the substrate to fill a wiring recess formed in the semiconductor substrate with plating metal includes performing an electroless plating process of forming an initial layer on the substrate, and performing an electrolytic plating process of filling the wiring recess with the plating metal, while the initial layer serves as a feeding layer.

14 Claims, 18 Drawing Sheets

U.S. PATENT DOCUMENTS

| | | | |
|---|---|---|---|
| 6,091,498 A * | 7/2000 | Hanson et al. | 356/623 |
| 6,117,784 A * | 9/2000 | Uzoh | 438/694 |
| 6,140,234 A * | 10/2000 | Uzoh et al. | 438/678 |
| 6,143,155 A * | 11/2000 | Adams et al. | 205/87 |
| 6,156,167 A * | 12/2000 | Patton et al. | 204/270 |
| 6,235,634 B1 * | 5/2001 | White et al. | 438/680 |
| 6,254,760 B1 | 7/2001 | Shen et al. | |
| 6,258,220 B1 | 7/2001 | Dordi et al. | |
| 6,258,223 B1 | 7/2001 | Cheung et al. | |
| 6,267,853 B1 * | 7/2001 | Dordi et al. | 204/232 |
| 6,294,059 B1 * | 9/2001 | Hongo et al. | 204/198 |
| 6,309,524 B1 * | 10/2001 | Woodruff et al. | 204/297.1 |
| 2002/0029961 A1 | 3/2002 | Dordi et al. | |

FOREIGN PATENT DOCUMENTS

| | | |
|---|---|---|
| JP | 51-149131 | 12/1976 |
| JP | 56-158424 | 12/1981 |
| JP | 56-161221 | 12/1981 |
| JP | 62-235499 | 10/1987 |
| JP | 63-26400 | 2/1988 |
| JP | 63026400 A * | 2/1988 |
| JP | 2-341 | 1/1990 |
| JP | 3-146698 | 6/1991 |
| JP | 03146698 A * | 6/1991 |
| JP | 5-98500 | 4/1993 |
| JP | 5-311496 | 11/1993 |
| JP | 5-331653 | 12/1993 |
| JP | 05331653 A * | 12/1993 |
| JP | 7-193214 | 7/1995 |

* cited by examiner

F I G. 5
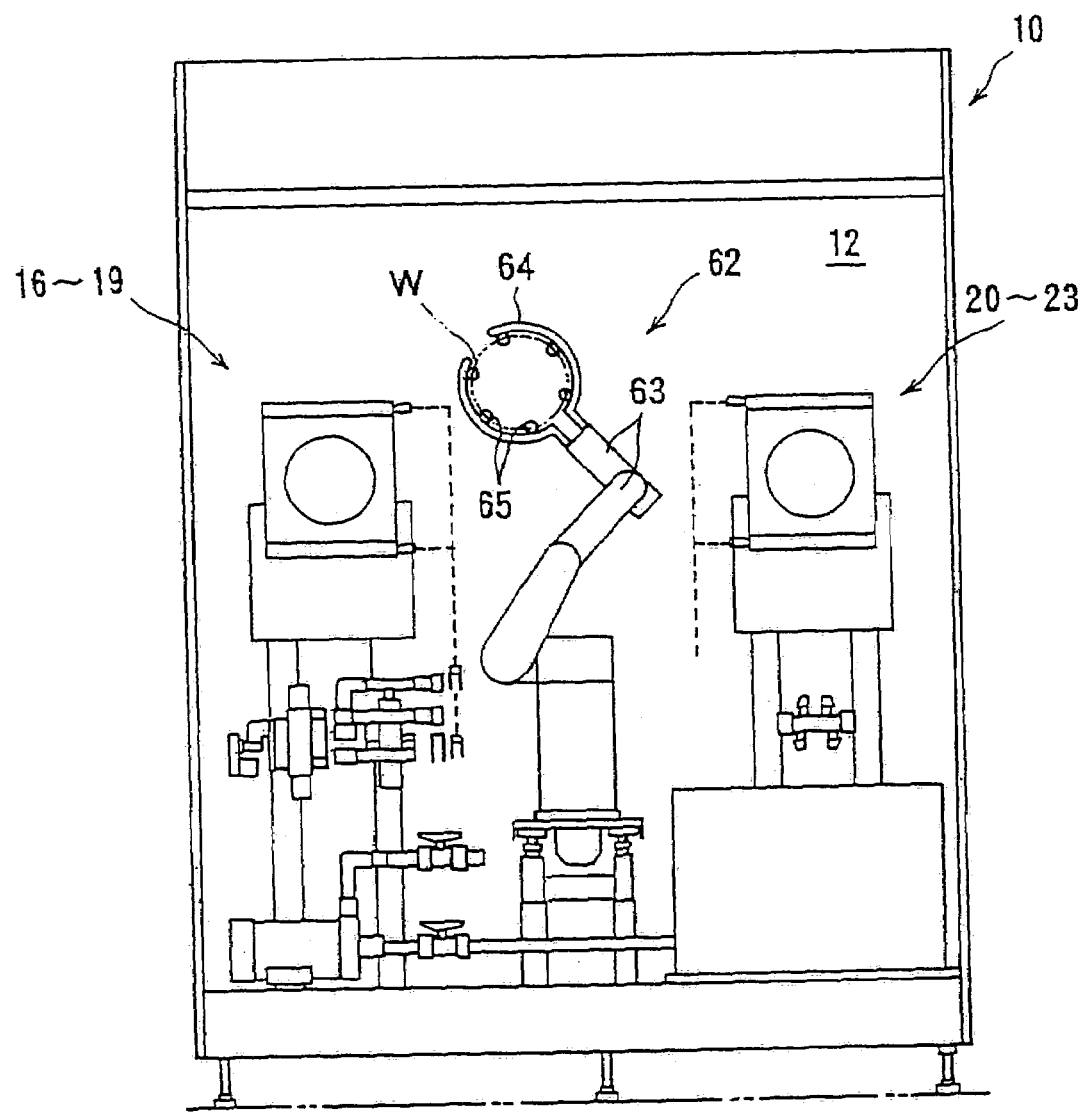

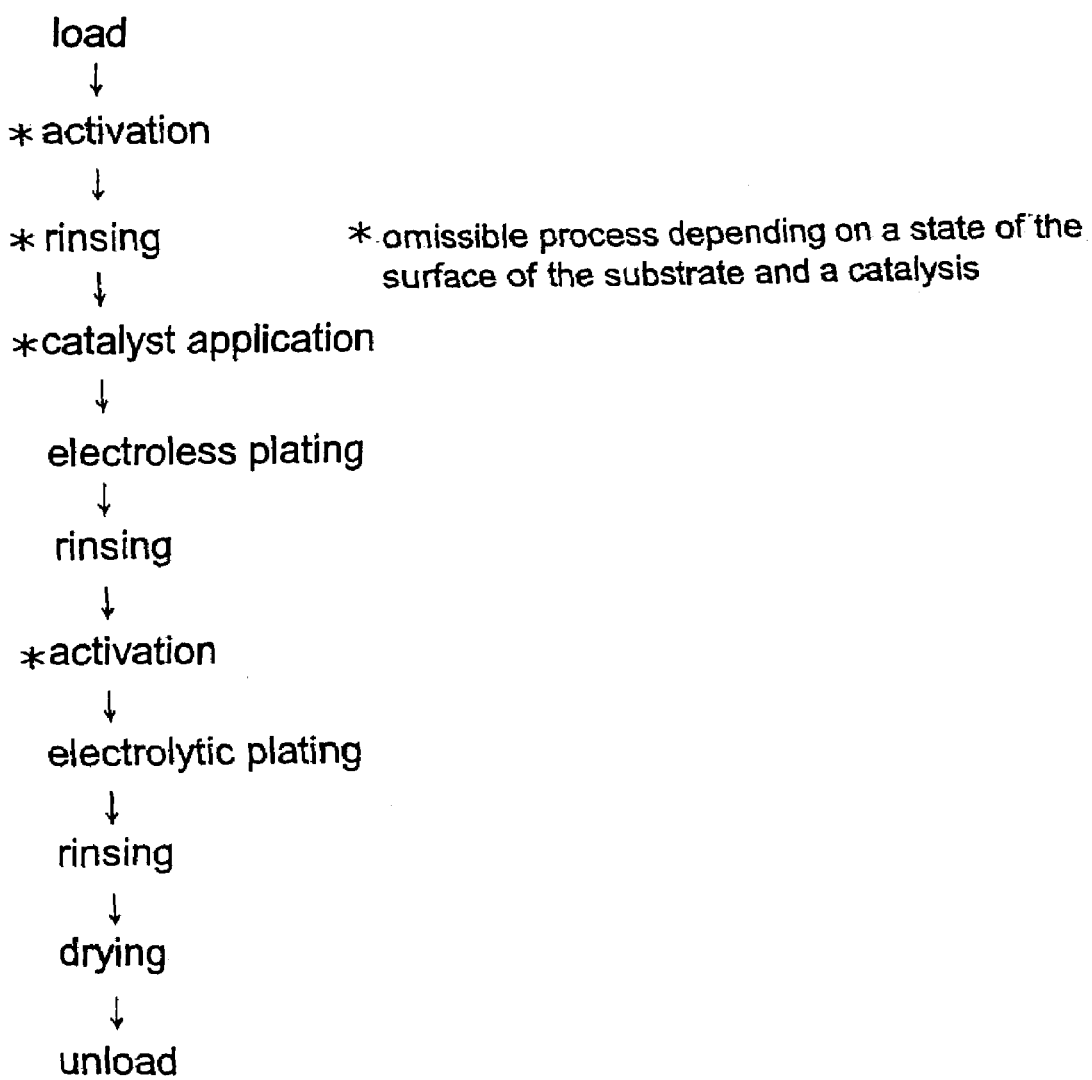

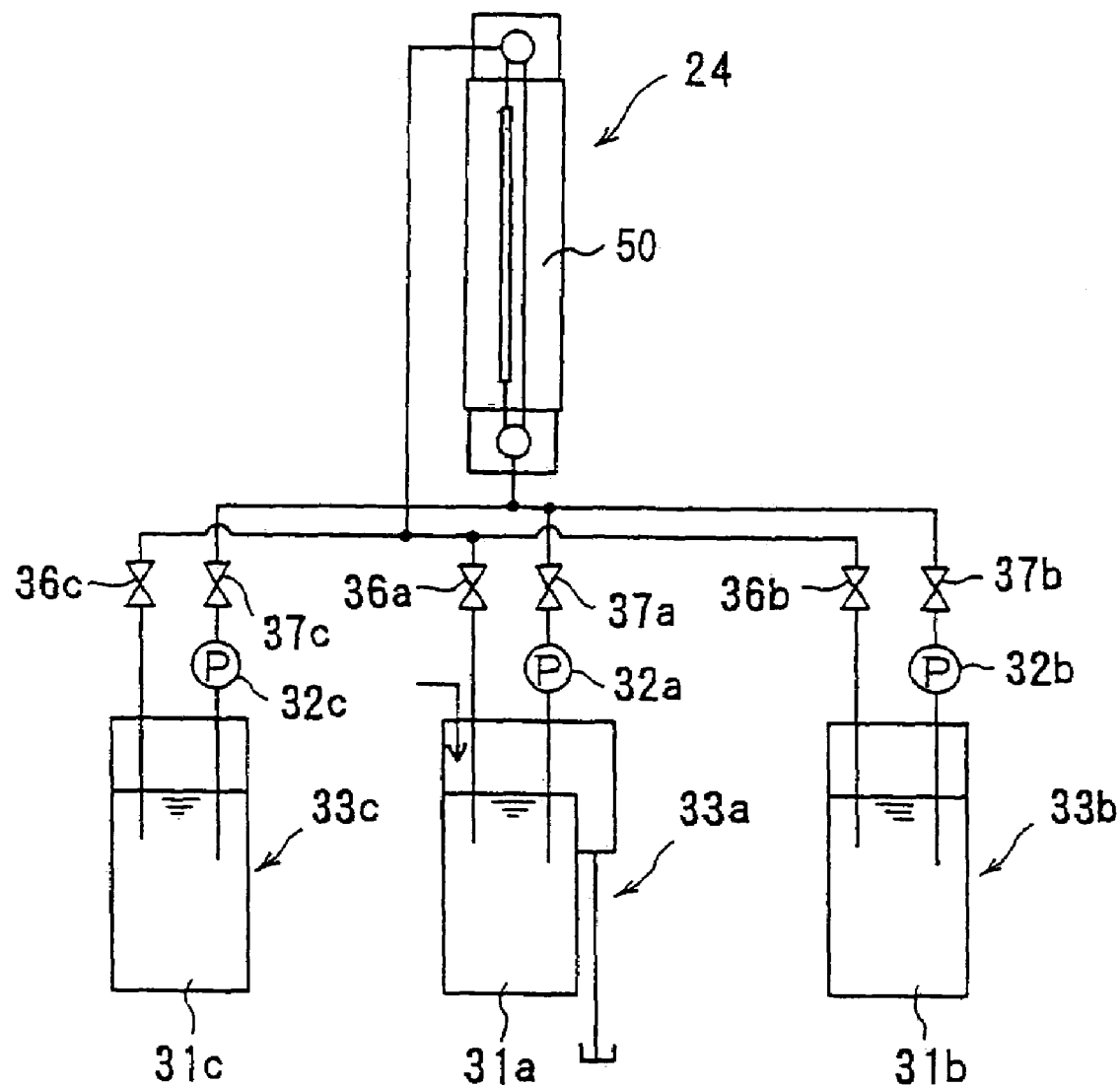
F I G. 8

F I G. 17
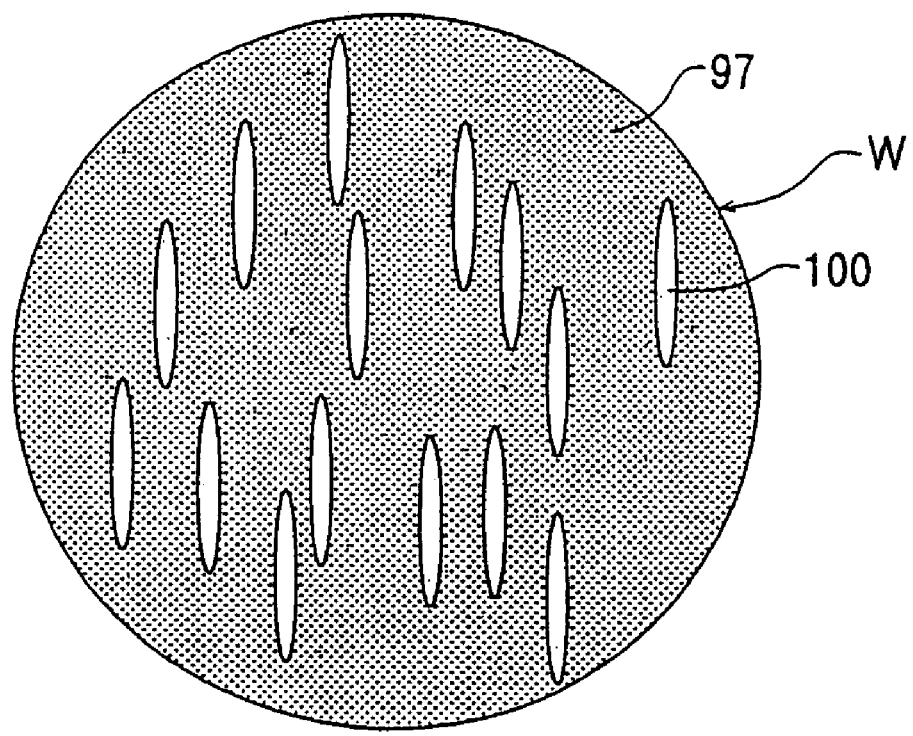
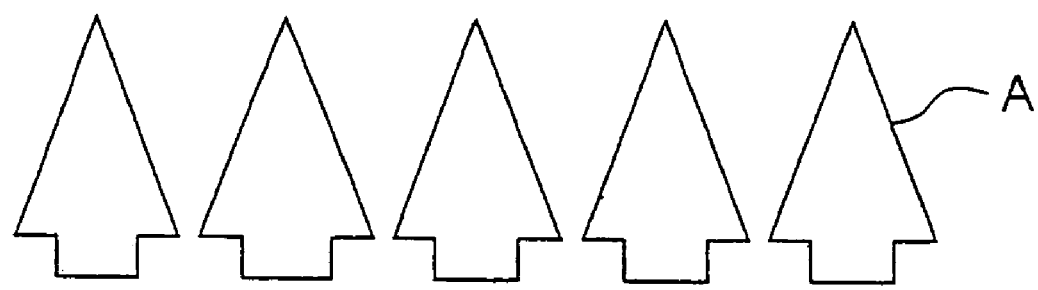

F I G. 1 9
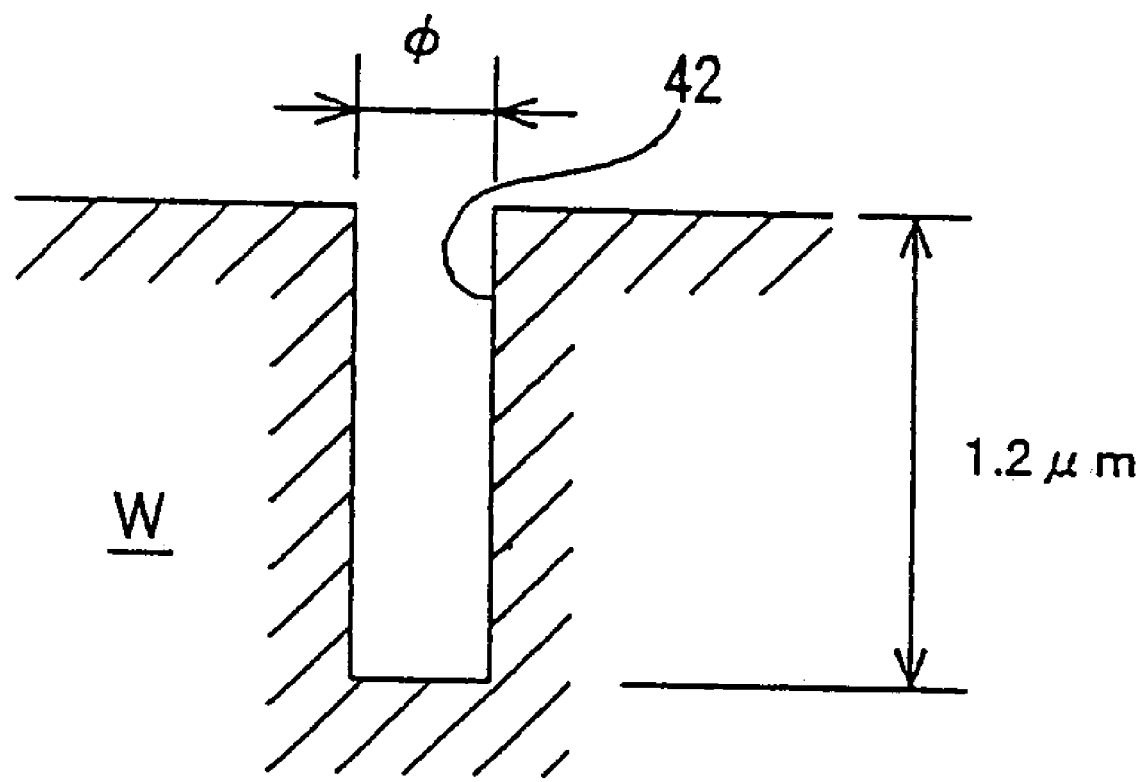

SUBSTRATE PLATING METHOD AND APPARATUS

TECHNICAL FIELD

The present invention relates to a method and apparatus for plating a substrate, and more particularly to a method and apparatus for plating a substrate to fill a wiring recess formed in a semiconductor substrate with wiring metal such as copper, copper alloy, or the like.

BACKGROUND ART

Conventionally, in order to form a wiring circuit on a semiconductor substrate, a layer of Al or Al alloy is deposited on a surface of a substrate by a sputtering process or the like, and then unnecessary portions are removed from the layer by a chemical dry etching process using a photoresist or the like for a mask pattern. However, as the level of integration of circuits increases, the width of wiring becomes narrower to thus increase current density, resulting in generating thermal stress in the wiring and increasing temperature of the wiring. As a result, the layer of Al or Al alloy becomes thinner due to stress migration or electromigration, and finally to cause a breaking of the wiring.

Hence, copper has been drawn much attention as a wiring material because of its lower resistance and higher reliability. However, it is difficult to form wiring by etching after a layer is deposited on a surface of a substrate and then performing a patterning process, which is different from a conventional method using Al. Therefore, there has been attempted a damascene process in which a wiring groove is preformed in a substrate and filled with copper by chemical vapor deposition (CVD), sputtering, plating, or the like, and then unnecessary portions are removed from the surface of the substrate by chemical mechanical polishing (CMP), for thereby forming wiring in the groove.

Among these processes for filling a wiring groove with copper, the plating process has drawn much attention because of the following advantages. The processing cost is lower than that in other processes, and pure copper material can be obtained, and the process can be performed at such a low temperature that a substrate is not damaged. The plating process mainly comprises an electroless plating process, which is mainly performed by a chemical process, and an electrolytic plating process, which is performed by an electrochemical process. The electrolytic plating process is generally more efficient than the electroless plating process.

Since copper is liable to be oxidized and corroded and diffused into $SiO_2$, wiring is generally formed after a wiring portion on a base material of the substrate is covered with a barrier layer of metal nitride such as TiN, TaN, and WN. Since the sheet resistance of this barrier layer is prohibitively larger than the resistance of the plating liquid, it has been difficult to perform uniform electrolytic plating on the barrier layer formed over the surface of the substrate.

Conventionally, a seed layer of copper is formed on the barrier layer by a sputtering process or a CVD process, and then plated with copper by an electrolytic plating process to fill fine recesses formed in the substrate with copper. However, it is difficult to uniformly deposit a layer on a wall of the fine recess by the sputtering process, and the CVD process introduces impurities into the deposited layer. Further, when the design rule is further decreased from about 0.18 μm to 0.10 μm, there is no dimensional margin to form a seed layer having a thickness of 0.02 to 0.05 μm within the recess.

On the other hand, in the electroless plating process, since the plating layer is grown in isogonic directions from a side wall or a bottom surface of the fine recess, an inlet of the recess is covered with metal grown from the side wall and hence, a void tends to be formed in the recess. In addition, since the plating rate of the electroless plating process is about one-tenth as slow as that of the electrolytic plating process, the electroplating process is inefficient.

SUMMARY OF THE INVENTION

It is therefore an object of the present invention to provide a method and apparatus for plating a substrate to form wiring by efficiently filling a fine recess formed in a semiconductor substrate with plating metal without a void or contamination.

When formalin (HCHO) is used in the electroless plating process as a reducing agent, hydrogen gas ($H_2$) is generated according to the following reaction.

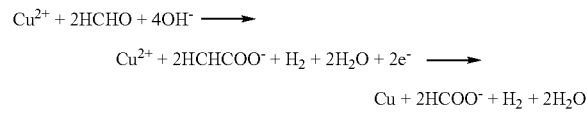

When a plating surface of a substrate W faces downwardly or sideways, as shown in FIGS. 16A and 16B, bubbles 98 are generated by hydrogen gas ($H_2$) in a plating liquid Q within recesses 42, such as fine grooves or the like, formed in the substrate, and these bubbles cause a plating defect 99. In order to prevent the generation of these plating defects 99, a pump or air is generally used to agitate the plating liquid in the conventional plating process. However, as shown in FIG. 16B, unevenly plated portions 100 are generated on a plating surface 97 of the substrate W in the direction that the hydrogen gas bubbles 98 move, indicated by an arrow A.

In order to remove the bubbles 98 from the plating surface 97, the conventional methods employ a jig to grip or suspend the plating substrate W, while a shock is applied externally to the jig to separate the bubbles from the plating surface 97. However, since there is risk that the shock will damage the jig or the plating substrate, this method is not desirable.

A conventional electroless plating apparatus comprises a plating processing tank and a plating liquid circulating tank, and a plating liquid is circulated during the plating process. The plating liquid is prepared in a special preparation bath or in the circulating tank. Therefore, problematic reactions specific to the electroless copper plating, such as a Cannizzaro reaction or a disproportionation, occur in the electroless plating liquid immediately after preparation to cause deterioration of the plating liquid and changes in concentration of the plating liquid composition.

Accordingly, it is another object of the present invention to provide a method and apparatus for electroless plating which can minimize the amount of plating defects and unevenly plated portions and can prevent deterioration of a plating liquid and changes in concentration of the plating liquid composition to perform a plating process with a highly stable quality.

In the conventional electrolytic plating, in order to grow a uniform layer in through holes formed in a printed circuit board using copper plating, the concentration of copper in the plating liquid is lowered to improve the throwing power (in a high throwing power bath). This is because the over-voltage of a cathode is increased by increasing the polarization of the cathode to improve the throwing power. A degree of liquid flow through the holes can be expected when the dimensions of the holes in the printed circuit board are about 50 to 100 µm.

The wiring grooves or holes formed in a surface of a semiconductor wafer have a width or diameter of 0.2 µm or less and do not pass through the substrate. Hence, it is impossible to flow a liquid through such fine grooves or holes. Further, the electrophoresis speed generated by the electric field is numerically small, and hence the holes are filled with copper ions almost entirely by the diffusion of ion concentration. The amount of diffusion of copper ions in the holes decreases in proportion to the second power of the hole diameter (the area of the inlet of the hole) as the hole diameter decreases.

In contrast, the amount of deposition of copper ions in the hole grows smaller in proportion to the diameter of the hole. Accordingly, copper ions can be expected to be diffusion-controlled in grooves and holes, as semiconductor devices become more integrated and the width of grooves and diameters of holes become smaller in the future. When the hole diameters drop below 0.15 µm, in particular, copper ions tend to be diffusion-controlled depending on a methods of agitating plating liquid for a large aspect ratio.

Therefore, it is another object of the present invention to provide a method and apparatus of electrolytic plating capable of sufficiently filling a fine groove and a hole formed in a surface of a substrate using a copper plating without copper ions becoming diffusion-controlled in the groove and the hole, even when the width of the groove and the diameter of the hole become smaller and the integration in the semiconductor devices increases.

According to a first aspect of the present invention, there is provided a method of plating a substrate to fill a wiring recess formed in a semiconductor substrate with plating metal, the method comprising; performing an electroless plating process of forming an initial layer on a substrate; and performing an electrolytic plating process of filling the wiring recess with plating metal while the initial layer serves as a feeding layer.

With this method, an initial plating layer (seed layer) is formed with an electroless plating process, and then the recess in the substrate is filled with electrolytic plating metal while the initial layer serves as the feeding layer. Accordingly, an electroless plating process with high uniformity is combined with an electrolytic plating process having good qualities in leveling and high-speed filling. The recess having a barrier layer of a high electrical resistance can efficiently be filled with a void-free wiring metal, without the sputtering process or the CVD process in a series of plating processes. By filling the greatest portion of the recess formed on the feeding layer with the electrolytic plating, it is possible to maintain a high plating speed and increase throughput.

The electroless plating process and the electrolytic plating process may be performed in the same plating processing tank or in separate processing tanks. Further, the same plating liquid may be used in the same plating processing tank to perform both of the electroless plating process for forming an initial layer serving as a feeding layer and the electrolytic process for filling the recess. With this method, both of the plating processes can continuously be performed without changing the processing tank or the plating liquid, for thereby simplifying the apparatus and process while achieving the above effects.

According to a second aspect of the present invention, there is provided an apparatus for plating a substrate to fill a wiring recess in a semiconductor substrate with plating metal, the apparatus comprising: an electroless plating tank for forming an initial layer on a substrate by electroless plating; an electrolytic plating tank for filling the wiring recess with plating metal while the initial layer serves as a feeding layer; and transfer means for transferring a substrate between the tanks.

With this apparatus, an initial plating layer (seed layer) is formed with an electroless plating process, and then the recess in the substrate is filled with electrolytic plating metal while the initial layer serves as the feeding layer. Accordingly, the recess having a barrier layer of a high electrical resistance can efficiently be filled with a void-free wiring metal, without the sputtering process or the CVD process in a series of plating processes. The electroless plating tank and the electrolytic plating tank should preferably be disposed in close proximity to each other within the same space and separated by a partition.

By providing a substrate transfer means in addition to the electroless tank and the electrolytic plating tank, it is possible to continue from one process to the next process without changing the state of the surface of the substrate when transferring the substrate. Specifically, the electroless plating tank, the electrolytic plating tank, and required rinse tanks should preferably be arranged in close proximity to each other, and the substrate should be transferred after the plating process or the rinsing process, without exposing the surface of the substrate to the air. Such a function may also be provided in the transfer means itself.

According to a third aspect of the present invention, there is provided a method or apparatus for plating a substrate according to the first or second aspect, comprising in the electroless plating process or the electroless plating bath; means for disposing a substrate to be plated in such a state that a surface to be processed thereof faces upwardly, and forming a hermetically sealed space by the surface to be processed; and plating liquid supply means for supplying an electroless plating liquid to the hermetically sealed space to perform an electroless plating process.

By facing the plating surface of the substrate to be plated upwardly, nitrogen gas bubbles certainly generated in the plating liquid in the electroless plating process will moved upwardly due to buoyancy. Accordingly, the number and the amount of bubbles remaining on the plating surface of the plating substrate and in the fine groove and hole can be reduced, thereby reducing the plating defects.

According to a fourth aspect of the present invention, there is provided a method or apparatus for plating a substrate according to the third aspect, wherein the minimum amount of electroless plating liquid required for performing a predetermined plating on the substrate to be plated is supplied to the hermetically sealed space, and the electroless plating process is performed with the electroless plating liquid in a static state. Since this method does not move the nitrogen gas bubbles over the plating surface, it is possible to minimize the unevenly plated portions that are generated on the plating surface, as shown in FIG. 17.

According to a fifth aspect of the present invention, there is provided a method or apparatus for plating a substrate according to the third or fourth aspects, further comprising: pressure pulsation means for generating a pressure in the hermetically sealed space that is higher than atmospheric pressure and for pulsating the pressure.

According to the present invention, since the hydrogen gas bubbles can be encouraged to dissolve into the electroless plating liquid by pressurization, it is possible to encourage the nitrogen gas bubbles to separate from the plating surface. Specifically, the nitrogen gas bubbles 98 attached to the plating surface 97 of the plating substrate W, as shown in FIG. 11A, are contracted by pressurization, as shown in FIG. 11B, to separate from the plating surface 97. The nitrogen gas bubbles 98 are expanded by decompression, as shown in FIG. 1C, to separate completely from the plating surface 97.

According to a sixth aspect of the present invention, there is provided a method or apparatus for plating a substrate according to any one of the third through fifth aspects, further comprising a preparation bath disposed in the vicinity of the hermetically sealed space for supplying the minimum amount of prepared electroless plating liquid to the hermetically sealed space just prior to the electroless plating process.

According to the present invention, the plating process is completed before an occurrence of problematic reactions specific to the electroless copper plating, such as a Cannizzaro reaction or a disproportionation, which cause deterioration of the plating liquid and changes in concentration of the plating liquid composition immediately after the preparation. Therefore, the plating process can be performed with a highly stable quality.

According to a seventh aspect of the present invention, there is provided a method or apparatus for plating a substrate according to the sixth aspect, wherein the electroless plating liquid is processed as a waste liquid without circulating the electroless plating liquid after performing the electroless plating process with the minimum amount of electroless plating liquid.

According to the present invention, since the amount of plating liquid used per deposition (deposition of plating layer) can be maintained to be the minimum required amount, it is possible to avoid increases in cost with the waste liquid and an excessive burden on the environment.

The plating substrate may be held on a turntable in the electroless plating tank to be rinsed and dried after the plating process. With this arrangement, the plating, rinsing, and drying processes can all be performed in the same area, thereby reducing the space required for device installation and making the device suitable for installation in a clean room.

A hot bath for maintaining temperature may be provided in the electroless plating tank in the vicinity of the top of the hermetically sealed space, and a heater for maintaining temperature may be disposed below the plating substrate. With this arrangement, it is possible to maintain a fixed plating temperature, which is one of the most important factors governing the quality (uniformity of layer thickness, reproducibility, electric conductivity of the plating layer, etc.) of electroless plating.

In the electroless plating process, the minimum required amount of electroless plating liquid may be set within a range of amount of liquid that includes ions of solutes 1.5 to 20 times as many as a predetermined deposited metal equivalent. In the electroless plating process, the pressure pulsation means may be configured to generate pressure pulsations having an amplitude of 0 to 1 MPa and a frequency of 0 to 10 Hz.

According to an eighth aspect of the present invention, there is provided a method or apparatus for plating a substrate according to the first or second aspects, wherein the plating liquid used in the electroless plating process or the electroless plating bath comprises copper sulfate ($CuSO_4 \cdot 5H_2O$) having a concentration of 100 to 250 g/l, sulfuric acid ($H_2SO_4$) having a concentration of 10 to 100 g/l, and chlorine ions having a concentration of 0 to 100 mg/l.

According to a ninth aspect of the present invention, there is provided a method or apparatus for plating a substrate according to the eighth aspect, wherein the electrolytic plating liquid further comprises at least 0.14 to 70 μmol/l of a sulfur compound expressed by a formula [A] below, 10 to 5000 mg/l of a macromolecular compound expressed in a formula [B] below, and 0.01 to 100 mg/l of a nitrogen compound; wherein L is an alkyl group having a carbon number of 1 to 6 which is substituted by a lower alkyl group, a lower alkoxyl group, a hydroxyl group, or a halogen atom; and X is a hydrogen atom, a —$SO_3M$ group, or a —$PO_3M$ group (M indicating a hydrogen atom, an alkali metal atom, or an amino group) in the formula [A]; and $R_1$ indicates a residue of a higher alcohol group having a carbon number of 8 to 25, a residue of an alkyl phenol with an alkyl group having a carbon number of 1 to 25, a residue of an alkyl naphthol with an alkyl group having a carbon number of 1 to 25, a residue of a fatty acid amide having a carbon number of 3 to 22, a residue of an alkylamine having a carbon number of 2 to 4, or a hydroxyl group; $R_2$ and $R_3$ indicate a hydrogen atom or a methyl group; and m and k indicate an integer from 1 to 100 in the formula [B],

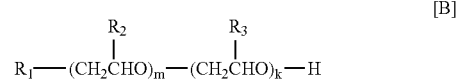

Since increases in copper concentration in the plating liquid generate proportional increases in the diffusion speed, it is possible to prevent copper ions from becoming diffusion-controlled in the groove and the hole, even when the width of the groove and the diameter of the hole become smaller and the integration in the semiconductor devices increases. Of course, it is also possible to produce a thinner diffusion layer and suppress the current density by agitating the plating liquid.

FIG. 18 is a graph comparing diffusion amount and deposition amount in a hole H of 2.2 μm shown in FIG. 19. In FIG. 18, the vertical axis represents the amount of copper deposition and the amount of copper diffusion (g/s), and the horizontal axis represents the diameter φ (μm) of the hole H. Here, the diffusion coefficient is set at $0.72 \times 10^{-9}$ $m^2$/s and the diffusion layer thickness at 5 μm. When the diffusion amount is greater than the deposition amount, the ions become reaction-controlled to prevent a depletion in copper ions in the hole H and the generation of voids therein. When the diffusion layer is less than the deposition amount, the ions become diffusion-controlled, and voids are generated in the hole H. As seen in FIG. 18, higher concentrations of copper sulfate are advantageous when the hole diameter becomes finer, while the sulfuric acid concentration relatively declines due to the relationship with saturated concentration. By reducing the sulfuric acid concentration, the electrical resistance of the plating liquid increases, improving the uniformity of the deposited layer thickness.

In FIG. 18, a curve A indicates the diffusion amount (per second) when the copper sulfate concentration is 225 g/l, a curve B indicates the deposition amount (per second) when the current density is 3 A/$dm^2$, a curve C indicates the deposition amount (per second) when the current density is 2.5 A/dm², a curve D indicates the deposition amount (per second) when the current density is 2 A/dm², and a curve E indicates the diffusion amount (per second) when the copper sulfate concentration is 75 g/l.

As described above, the plating liquid includes the sulfur compound shown in equation [A] of 0.14 to 40 µmol and the macromolecular compound shown in equation [B]. This sulfur compound can achieve a fine deposition. Some examples of these compounds include N, N-dimethyldithiocarbamylpropylsulfonic acid, O-ethyl-S-(3-propylsulfonic acid)-dithiocarbonate, bis-(sulfopropyl) disulfide, and their salts.

In the present invention, the amount of additive in the sulfur compound should preferably be 0.14 to 70 µmol/l, since the amount of copper sulfate is greater than the amount of sulfuric acid. The amount of additive in the sulfur compound is less than that in the case where a solution with a low concentration of copper sulfate is used because the cathode vicinity is rich in copper ions, requiring less sulfur compound as an accelerating agent.

Some examples of a macromolecular organic additive contained in the plating liquid are PPG and PEG, their random or block polymers, or a derivative thereof, such as a polyether type. The amount of macromolecular organic additive is about 10 to 5000 mg/l.

A leveler is added to the above plating liquid to further control the copper deposition and accelerate plating growth in the bottom of the hole. The leveler is a nitrogen compound containing a polyalkylene imine, such as a phenazine compound, a phthalocyanine compound, a polyethylene imine, and a polybenzyl ethylene imine, or a derivative thereof, or a thiourea derivative such as an N-dye substitute compound, a safranine compound, such as a phenosafranine, a safranine azo naphthol, a diethyl safranine azo phenol, and a dimethyl safranine dimethyl aniline, or a polyepichlorohydrine or a derivative thereof, or a phenylthiazonium compound such as a thioflavine, or a amide type, such as an acrylamide, a propylamide, and a polyacrylic acid amide. This nitrogen compound of about 0.01 to 100 mg/l is added as a leveler.

According to the present invention defined in a tenth aspect, there is provided an apparatus for plating a substrate to fill a wiring recess formed in a semiconductor substrate with plating metal, the apparatus comprising: one processing tank having an electroless plating liquid supply path for supplying an electroless plating liquid to form an initial layer on a substrate by an electroless plating process, and an electrolytic plating liquid supply path for supplying an electrolytic plating liquid to fill the wiring recess by electrolytic plating while the initial layer serves as a feeding layer; wherein the two paths are selectively switchable.

Hence, an initial plating layer (seed layer) is formed with an electroless plating process, and then the recess in the substrate is filled with electrolytic plating metal while the initial layer serves as the feeding layer. Accordingly, the recess having a barrier layer of a high electrical resistance can efficiently be filled with a void-free wiring metal, without the sputtering process or the CVD process in a series of plating processes. Since both of the electroless plating process for forming the initial layer and the electrolytic plating process for filling the recess can be performed continuously in the same processing tank, the equipment and time required to transfer the substrate can be minimized and the state of the surface of the substrate can be prevented from changing. A cleaning liquid supply path for cleaning a substrate may be disposed to perform a cleaning process in the same processing tank.

The processing tank may be hermetically sealed with a parallel flow. With this arrangement, a plating liquid can flow along the surface of the substrate at a high speed even in a small space to thus perform the efficient plating with sufficient flowability of the plating liquid.

According to an eleventh aspect of the present invention, there is provided a method or apparatus for plating a substrate according to any one of the first through tenth aspects, wherein the plating liquid used in the method or apparatus does not include an alkali metal as a pH regulator.

BRIEF DESCRIPTION OF DRAWINGS

FIG. 5 is a side view of the plating apparatus in FIG. 1;

FIG. 6 is a flowchart showing processes performed with the plating apparatus in FIG. 1;

FIG. 8 is a schematic view showing a processing tank used in a plating apparatus according to a second embodiment of the present invention;

FIG. 16A shows the behavior of the hydrogen gas bubbles when a plating surface of a plating substrate faces downwardly, and FIG. 16B shows the behavior of the hydrogen gas bubbles when the plating surface of the plating substrate faces sideways;

FIG. 17 is a schematic diagram explanatory of unevenly plated portions generated on a plating surface of a plating substrate by the behavior of hydrogen gas bubbles in electrolytic plating;

FIG. 19 is a schematic view showing an example of a shape of a hole formed in a surface of a plating substrate.

DETAILED DESCRIPTION OF THE INVENTION

Figure 1:
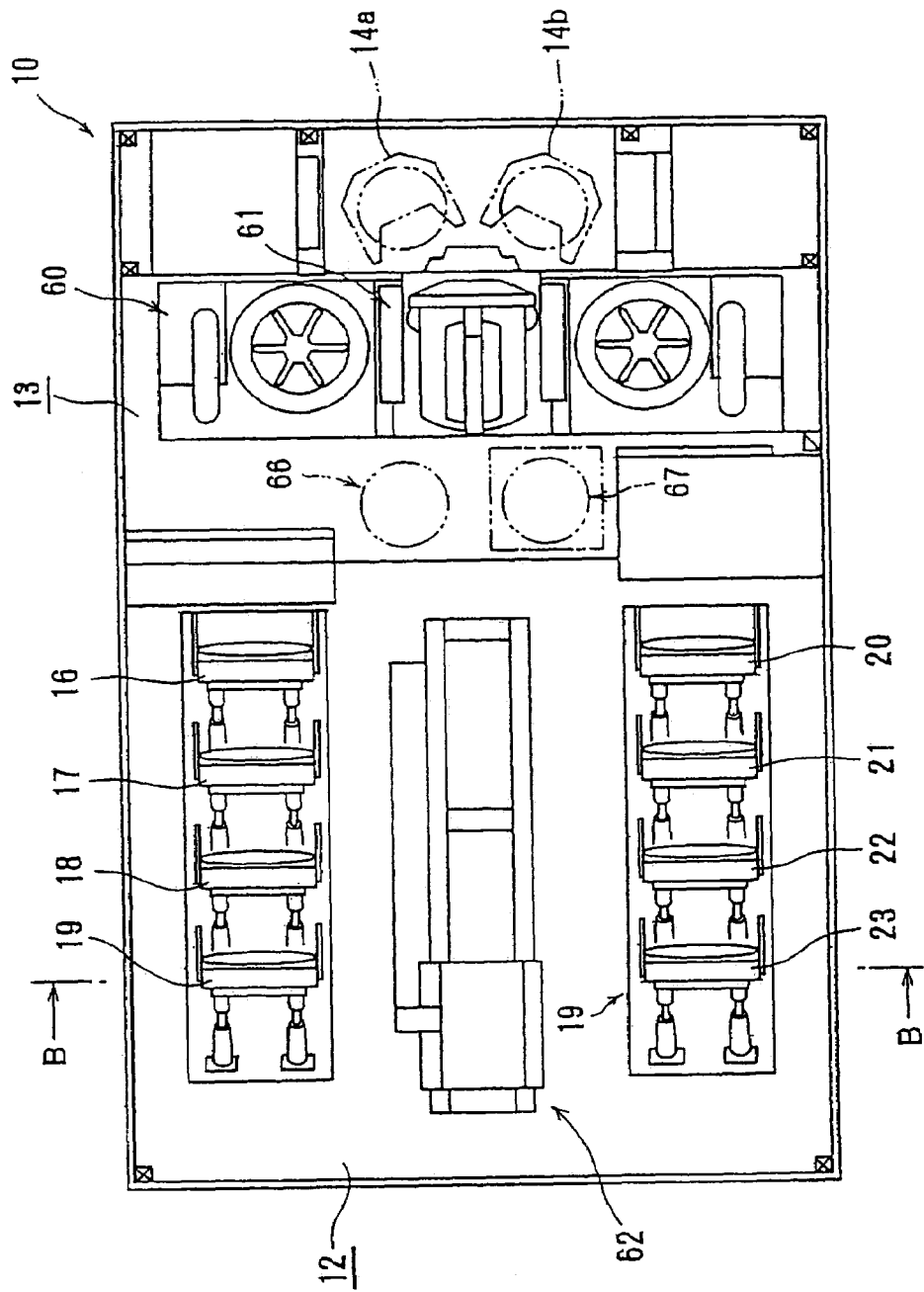
FIG. 1 is a plan view showing a whole structure of a plating apparatus according to a first embodiment of the present invention.

Embodiments according to the present invention will be described below with reference to the accompanying drawings. A plating apparatus is disposed in a rectangular installation frame 10, as shown in FIG. 1. The plating apparatus has a clean zone 13 at one side of the installation frame 10, and load/unload units 14a, 14b and two cleaning and drying devices 60 for post-processing a substrate, after the plating process, are disposed at the clean zone 13. A transfer device (first transfer robot) 61 for transferring a substrate is provided among the load/unload units 14a, 14b and the cleaning and drying devices 60. The plating apparatus has a contaminated zone 12 at the other side of the installation frame 10, and a second transfer robot 62 movable on a rail is disposed at the central portion of the contaminated zone 12. An $SnCl_2$ solution tank 16 containing $SnCl_2$ solution used as an activator in plating, a rinse tank 17, a $PdCl_2$ solution tank 18 containing $Pdcl_2$ solution used as a catalyst in electroless plating, and a rinse tank 19 are disposed in order on one side with respect to the second transfer robot 62. An electroless plating tank 20, a rinse tank 21, an electrolytic plating tank 22, and a rinse tank 23 are disposed in order on the other side with respect to the second transfer robot 62. The rinse tanks 11, 19, 21 and 23 may be provided as needed.

Figure 2:
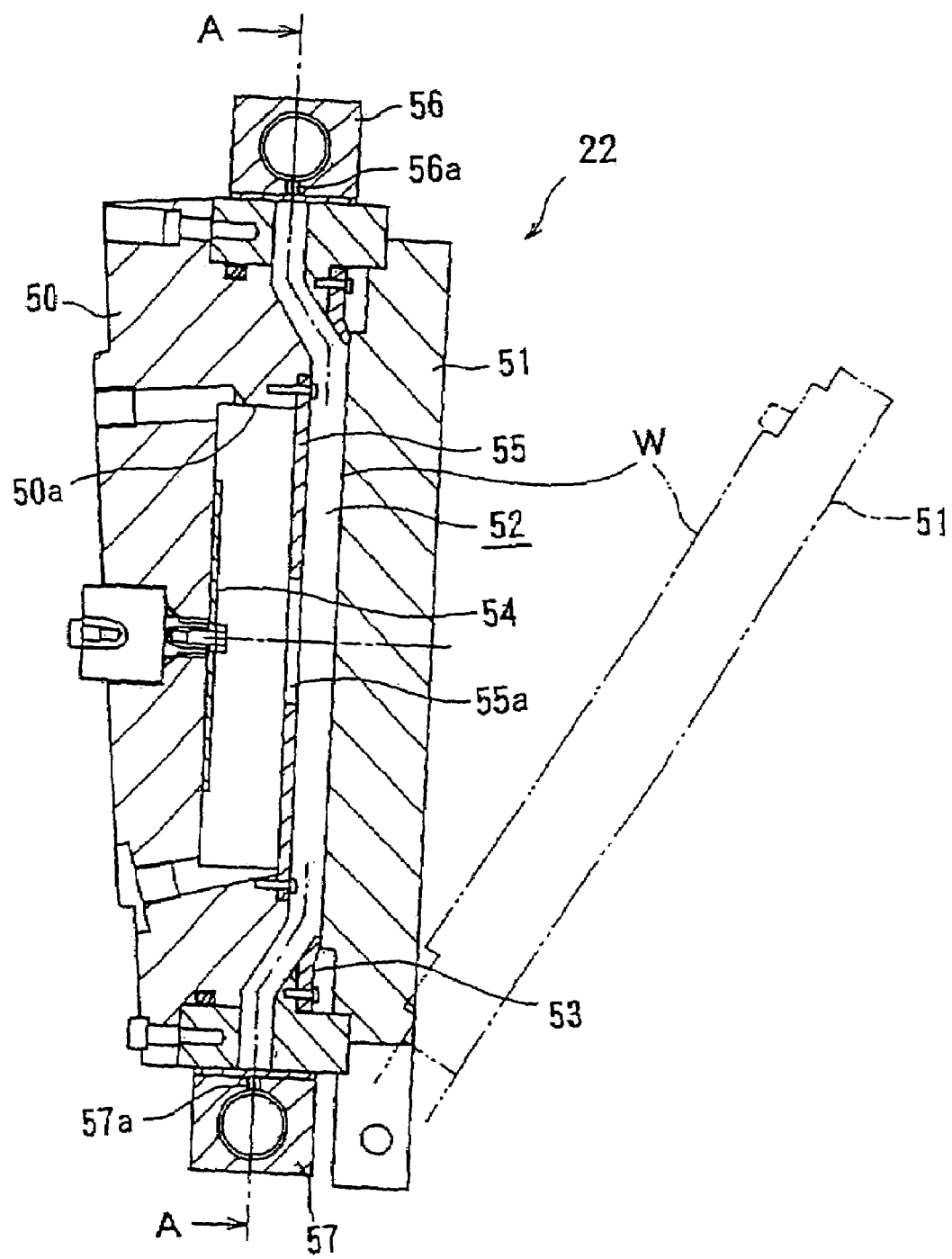
FIG. 2 is a side view showing a processing tank used in the plating apparatus of FIG. 1.

Each of these processing tanks 16–23 has the same basic shape and structure, and comprises a processing container body 50 having a rectangular plate shape and a recess 50a forming a processing chamber 52 therein, and a cover 51 capable of opening and closing a front opening of the processing container body 50, as shown in FIG. 2. A packing 53 is mounted at the peripheral portion of the processing container body 50 to maintain the water-tightness of the processing container body 50 when the cover 51 is closed and brought into close contact with the processing container body 50. A holding member for detachably holding a substrate W is provided on the inner side of the cover 51, and the cover 51 is provided with a sensor (not shown) for detecting the existence of a substrate W on the holding member.

In the processing tank (electrolytic plating tank) 22 for performing electrolytic plating, a plate-like anode 54 is mounted on the bottom of the recess 50a in the processing container body 50 in parallel with the processing chamber 52, and a shielding plate 55 made of dielectric material is disposed at the opening end of the recess 50a. The shielding plate 55 has an opening 55a therein for regulating the electric field on a plating surface of the substrate W. The other processing tanks are not provided with the anode 54 or the shielding plate 55.

Figure 3:
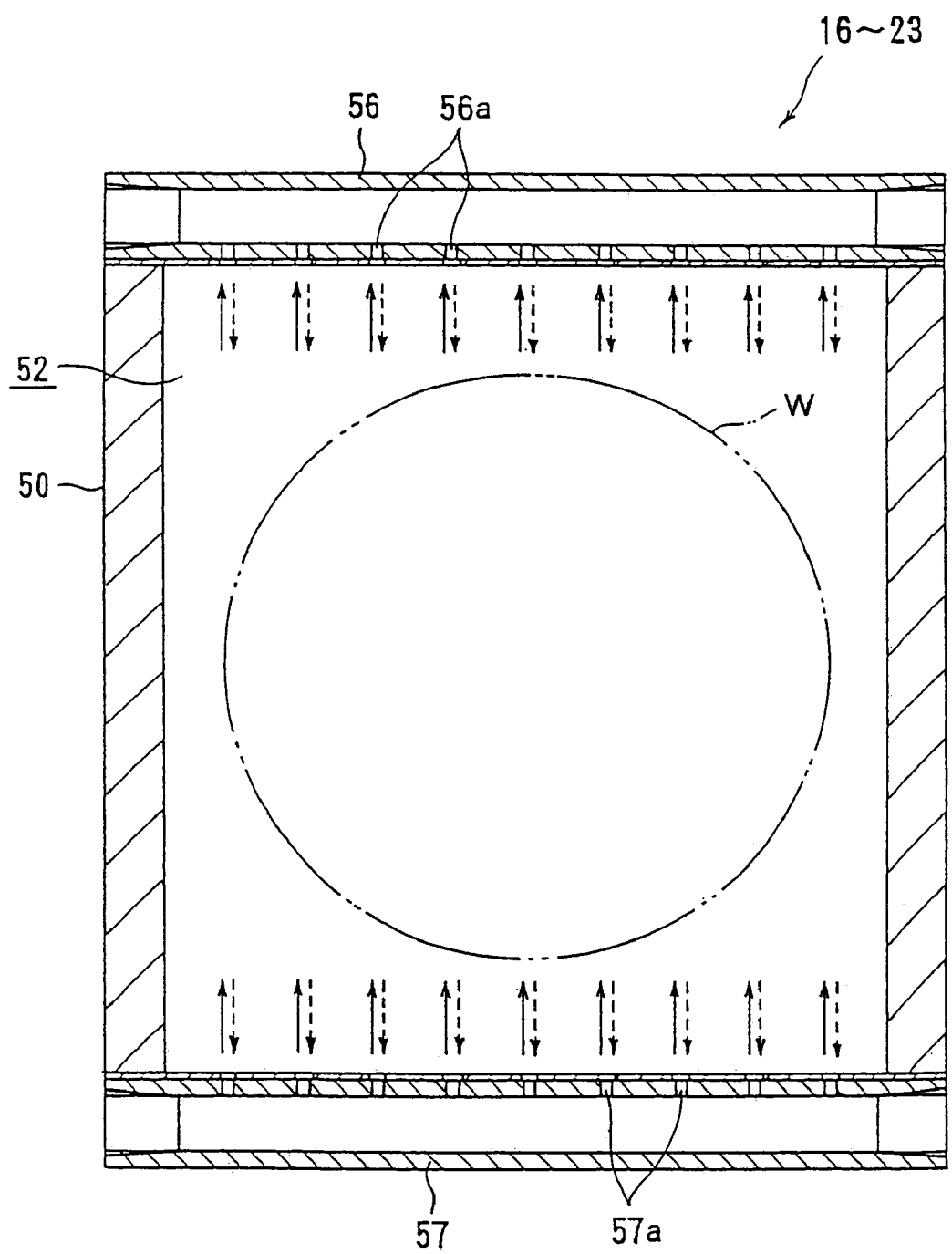
FIG. 3 is a cross-sectional view taken along a line A—A of the processing tank in FIG. 2.
Figure 4:
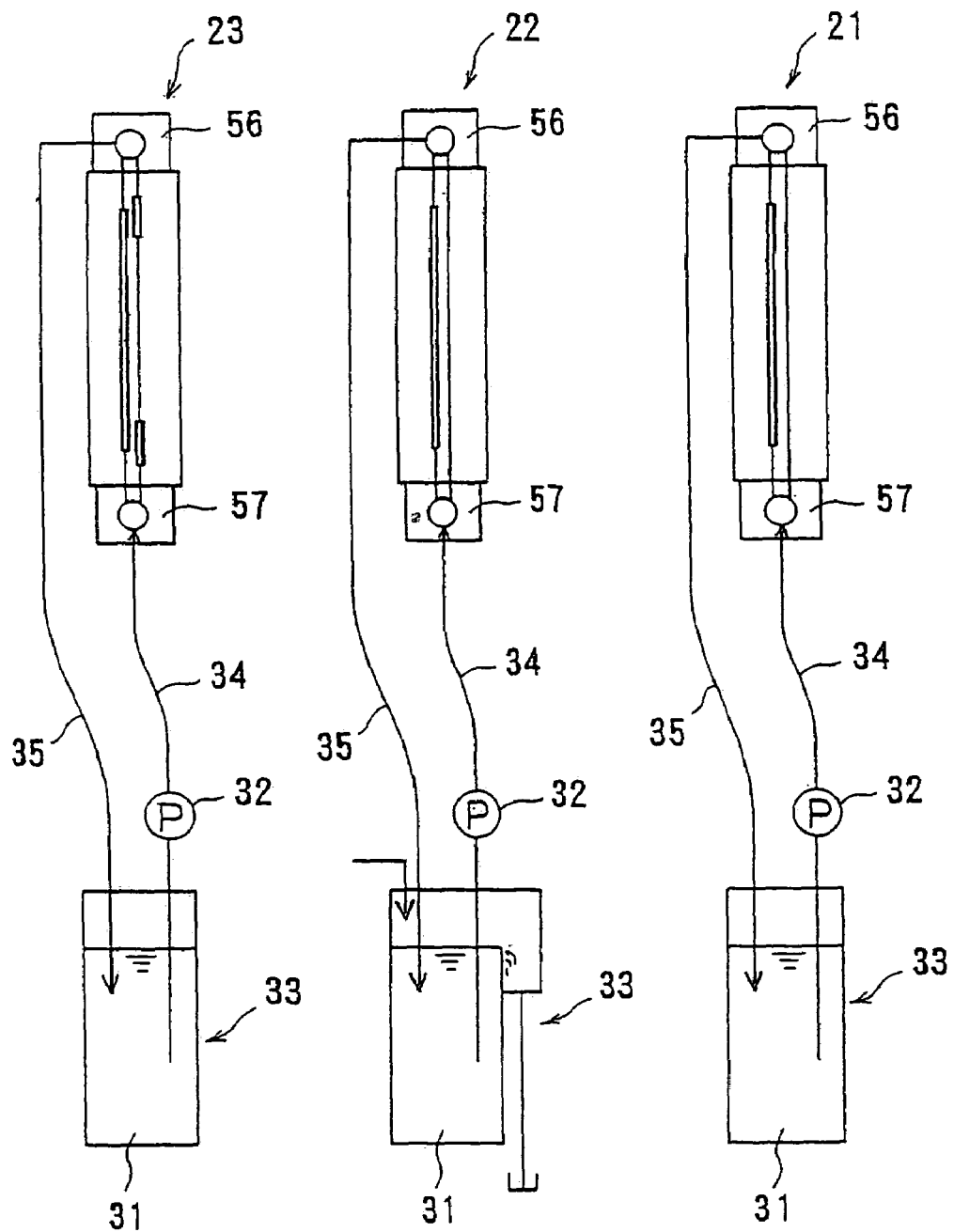
FIG. 4 is a schematic view showing the processing tank used in the plating apparatus in FIG. 1 and circulating paths of a processing liquid.

An upper header 56 and a lower header 57 are mounted on the top and bottom of the processing container body 50 and communicate with the processing chamber 52 via a plurality of through-holes 56a, 57a, respectively. Thus, for example, a processing liquid is supplied from the lower header 57 to the upper header 56 to thus generate a parallel flow along the surface of the substrate to be plated, as shown in FIG. 3. As shown in FIG. 4, processing liquid circulating devices 33 each having a reservoir tank 31 and a circulating pump 32 are provided below the processing tanks 16–23, and a supply pipe 34 and a return pipe 35 extending from the processing liquid circulating device 33 are connected to the lower header 57 and the upper header 56.

Since, as described above, the plating tanks 20, 22 are hermetically sealed with a parallel flow, a plating liquid can flow along the surface of the substrate at a high speed even in a small space to thus perform the efficient plating with sufficient flowability of the plating liquid. Further, each of the processing tanks 16–23 is vertically positioned, and hence bubbles in fine recesses formed in the substrate W can easily flow out therefrom during the plating process or the like. Therefore, uniformity of the plating reaction and the processing rate can be increased, and simultaneously the installation area of the processing tanks 16–23 can be reduced, resulting in an efficient arrangement of the processing tanks.

In this embodiment, the transfer robot 62 comprises a hexaxial robot having a plurality of arms 63 and a hand 64 which is provided on the end of the arms 63 and is capable of opening and closing (see FIG. 5). A plurality of rollers 65 are rotatably supported on the inner surface of the hand 64. A temporary holding stage 66 having a plurality of supports is provided in the clean zone 13 and used for temporarily holding a substrate W to be transferred between the clean zone 13 and the contaminated zone 12.

Next, the plating process according to the plating apparatus thus constructed will be described below with reference to FIGS. 6 and 7. The first transfer robot 61 takes out a substrate W held on the load/unload unit 14a, 14b and places the substrate W on the temporary holding stage 66. The second transfer robot 62 transfers the substrate W to the contaminated zone 12, and, when necessary, the substrate W is inserted into the processing container body 50 of the activation tank 16 and activated by a processing liquid containing an activator such as $SnCl_2$. Next, the substrate W is transferred to the adjacent rinse tank 17 to be rinsed, and then transferred to the catalyst application tank 18 to receive a catalyst application.

In this process, $Sn^{2+}$ ions from the activator are adsorbed by the surface of the substrate W in the activation tank 16, and these ions are oxidized in the catalyst application tank 18 to be $Sn^{4+}$. On the other hand, $Pd^{2+}$ ions are reduced to Pd metal, and the Pd metal is deposited on the surface of the substrate W to serve as a catalyst in the following electroless plating process. A single catalyst containing Pd/Sn colloids may be used in this process. In this embodiment, the catalyst application process described above is performed in the activation tank 16 and the catalyst application tank 18 belonging to a portion of the plating apparatus. However, the catalyst application process may be performed in a separate apparatus, and then the substrate W may be transferred to the plating apparatus. It is possible to dispense with the activation process and/or the catalyst application process in some cases, depending on a material or a state of the inner surface of the recess formed in the semiconductor substrate.

Figure 7A:
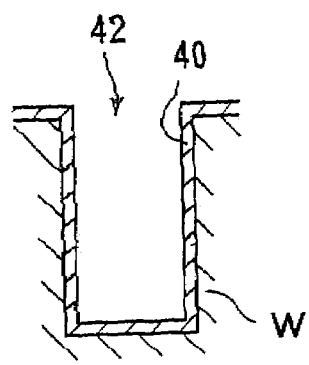
FIGS. 7A through 7D are schematic diagrams explanatory of a process of plating a recess formed in a substrate.
Figure 7B:
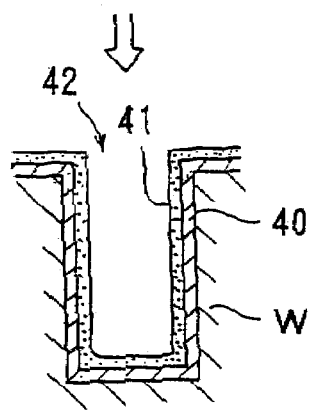

The second transfer robot 62 further transfers the substrate W to the electroless plating tank 20, where the electroless plating process is performed with a predetermined reducing agent and a predetermined plating liquid. With this process, as shown in FIGS. 7A and 7B, an electroless plating layer 41 is formed on the inner surface of a barrier layer 40. In this case, electrons generated at the solid-liquid interface due to decomposition of the reducing agent are applied to the $Cu^{2+}$ via the catalyst on the surface of the substrate, and hence Cu metal is deposited on the catalyst to form the copper layer 41. In addition to Pd, other transition metals such as Fe, Co, Ni, Cu, and Ag may be used as the catalyst.

Figure 7C:
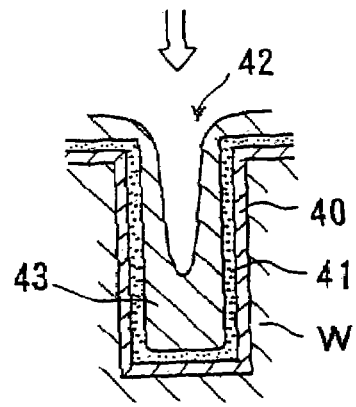
Figure 7D:
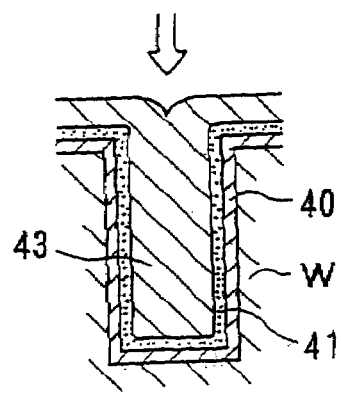

Next, the substrate W is transferred to the electrolytic plating tank 22 by the transfer robot, and the copper layer 41 formed by the electroless plating process is connected to an electrode to perform the electrolytic plating process with a predetermined plating liquid, for thereby filling the recess 42 with electrolytic plating metal 43, as shown in FIGS. 7C and 7D.

After the electrolytic plating process is completed, the substrate is taken out by the second transfer robot and transferred to the rinse tank to be rinsed and then placed on a second temporary holding stage 67. The substrate is held by the first transfer robot 61 and transferred to the cleaning and drying device 60 to be cleaned and dried for finishing, and returned to the load/unload unit 14a, 14b. The substrate is finally transferred to a chemical mechanical polishing apparatus (CMP) to remove unnecessary plating metal from the surface of the substrate with the chemical mechanical polishing process.

FIG. 8 shows a plating apparatus according to another embodiment of the present invention. The plating apparatus comprises a vertical processing tank 24 as in the previous embodiment, and processing liquid circulating devices 33a, 33b, 33c for circulating and supplying a respective processing liquid (electroless copper plating liquid, rinse water, and electrolytic copper plating liquid) to the processing tank 24. Supply of the processing liquid can be switched by switching valves 36a through 36c and 37a through 37c. The processing tank 24 comprises a processing container base 50 having an anode 54 and a shielding plate 55 therein, as in the example shown in FIG. 2, and can perform the electrolytic plating process.

In this embodiment, for example, after the electroless plating process is completed, the plating liquid is returned to the reservoir tank 31a. A rinse water circulating pump 32b is operated to introduce rinse water into the processing tank 24, and then an electrolytic plating liquid is introduced from the reservoir tank 31c into the processing tank 24. After the electrolytic plating process is completed, a rinsing process is similarly performed. Thus, it is possible to eliminate such problems that plating liquids are mixed with each other. In this embodiment, the electroless copper plating process, the rinsing process, the electrolytic copper plating process, the rinsing process, and other processes can be continuously performed in the same processing tank 24 without transferring a substrate, simply by changing processing liquids. Therefore, the present embodiment can decrease the number of the required tanks compared with the previous embodiment and can eliminate the need of a transfer robot for transferring a substrate between tanks, for thereby compacting a installation frame. Further, throughput is increased as the transferring time can be eliminated.

Figure 9:
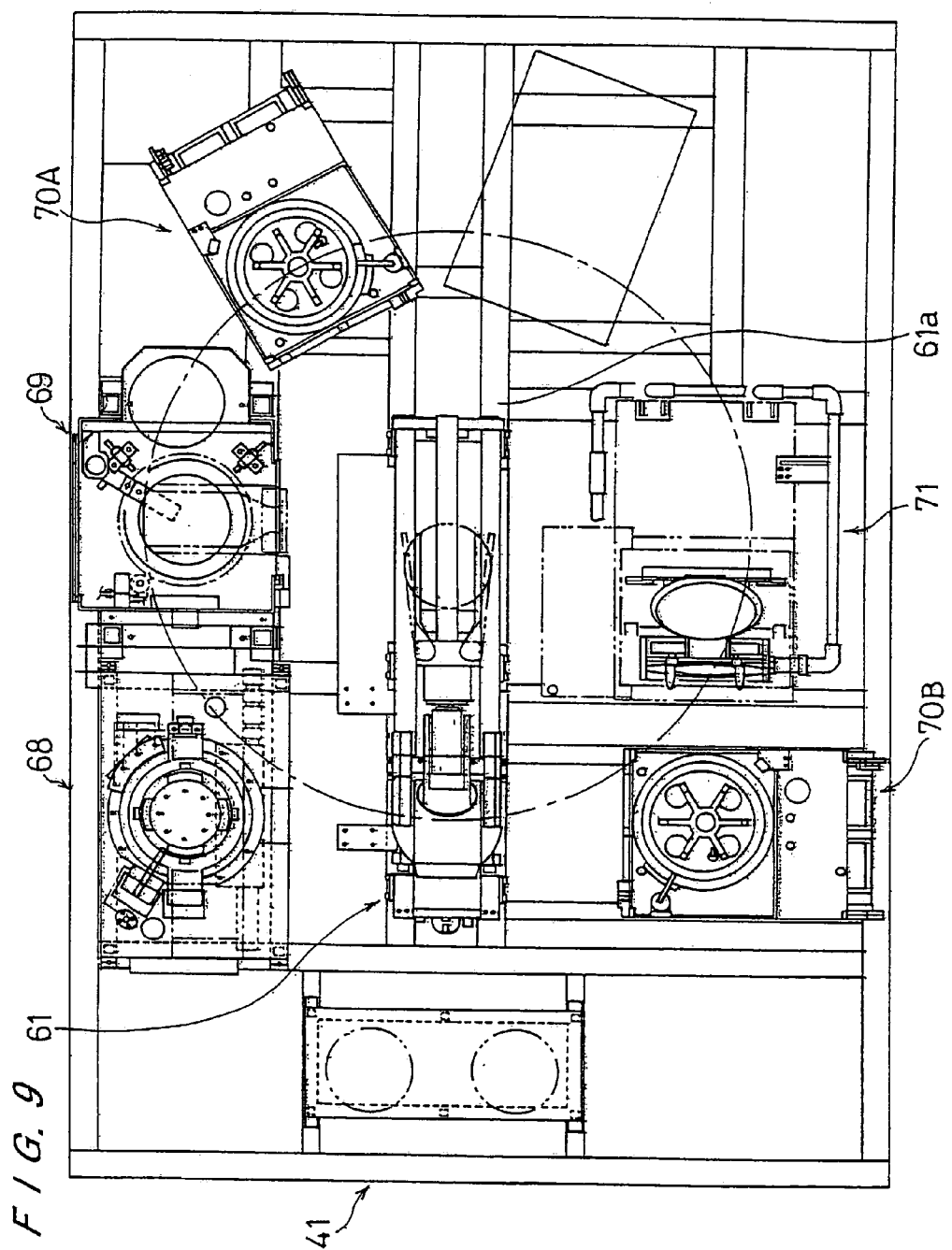
FIG. 9 is a plan view showing a whole structure of a plating apparatus according to a third embodiment of the present invention.

FIG. 9 shows a plating apparatus according to still another embodiment of the present invention. A transferring rail 61a is extended from one side of a rectangular frame to the other side of the frame, and a transfer device (transfer robot) 61 is movably provided on the transferring rail 61a. A load/unload unit 41, a pre-treatment unit 68, an electroless plating unit 69, a first spin drying unit 70A, an electrolytic plating unit 71, and a second spin drying unit 70B are clockwise disposed in order so that these units surround the transfer robot 61. The pre-treatment unit 68 comprises an activator ($SnCl_2$ solution) tank or a catalysis ($PdCl_2$ solution) tank, for example.

Figure 10:
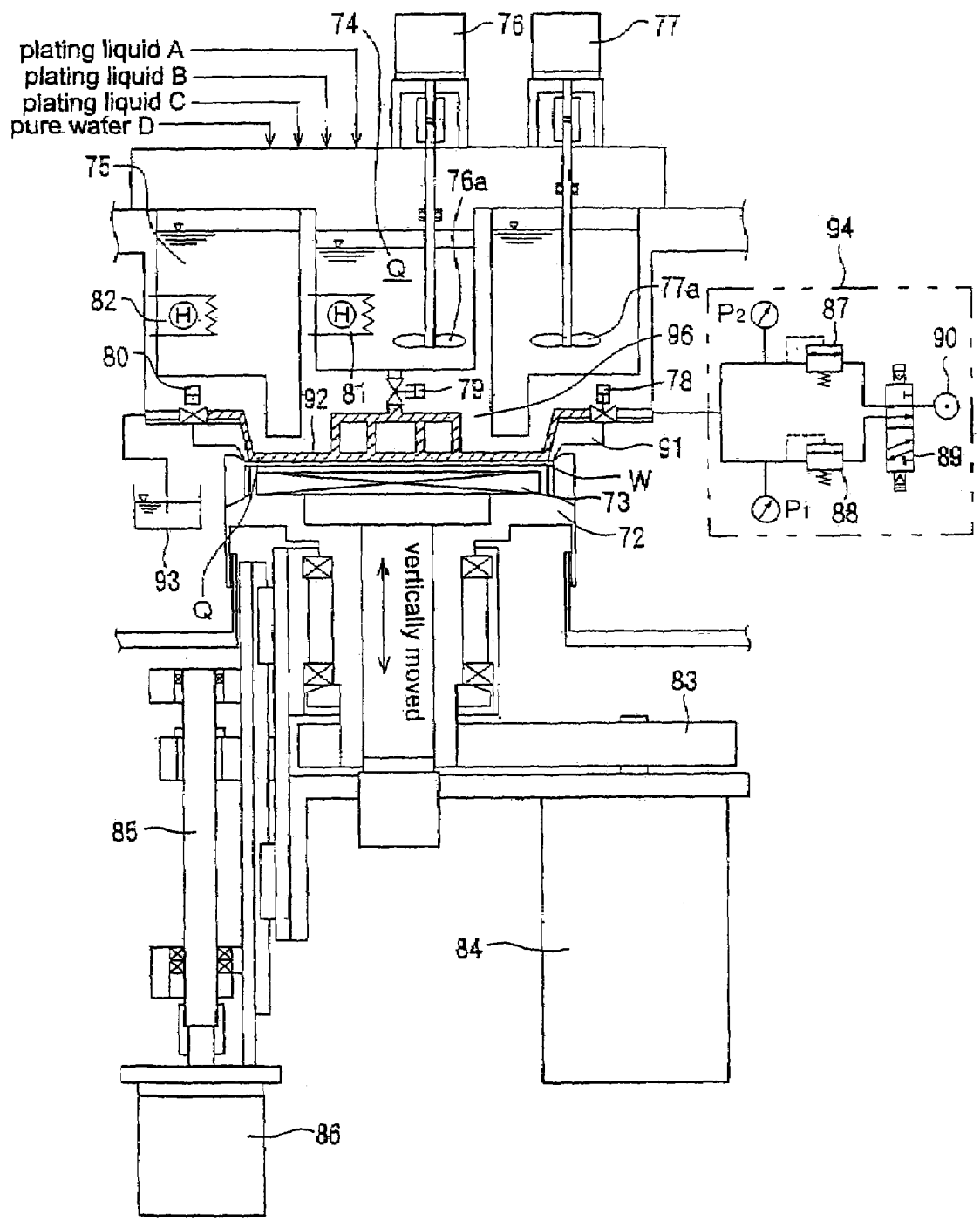
FIG. 10 is a schematic view showing a structure of an electroless plating device in FIG. 9.

FIG. 10 is a schematic view showing a configurational example of the electroless plating unit 69 shown in FIG. 9. The electroless plating unit 69 has a turntable 72 for holding a substrate W to be plated such as a semiconductor substrate thereon. A heater 73 for maintaining temperature is provided in the turntable 72, and the turntable 72 can be moved vertically via a ball screw 85 by a motor 86 and rotated via a timing belt 83 by a motor 84.

A plating cell 92 having an opening in its lower surface is disposed above the turntable 72, and a seal packing 91 which is brought into close contact with the plating substrate W held by a housing 96 is provided at the outer edge of the lower end of the plating cell 92. Specifically, when the turntable 72 is upwardly moved, a hermetically sealed space is formed in the plating cell 92 in such a state that the surface of the plating substrate W is brought into close contact with the seal packing 91. The hermetically sealed space has a volume sufficient for accommodating the minimum amount of plating liquid (electroless plating liquid) required for performing a predetermined plating on the surface of the plating substrate W, as described later.

A preparation bath 74 is disposed in the vicinity of the upper portion of the plating cell 92 and supplied with plating liquids A, B, C, and pure water D. An impeller 76a connected to an agitator 76 is disposed in the preparation bath 74, and a heater 81 is disposed in the preparation bath 74. A plating liquid in the preparation bath 74 is supplied to the plating cell 72 via a plating liquid supply valve 79.

A hot bath 75 is disposed in the vicinity of the outer portion of the preparation bath 74 so as to surround the preparation bath 74. An impeller 77a connected to an agitator 77 is disposed in the hot bath 75, and a heater 82 is disposed in the hot bath 75. The reference numeral 80 denotes a plating liquid discharge valve for discharging a plating liquid after the plating process is completed in the plating cell 92. A plating liquid discharged through the plating liquid discharge valve 80 flows into a waste liquid tank 93. The reference numeral 78 denotes a pressure supply valve for supplying pressure into the plating cell 92. The pressure in the plating cell 92 can be pulsed via the pressure supply valve 78 by a pressure pulsation generator 94.

The pressure pulsation generator 94 comprises a pressure regulator valve 87 for high pressure, a pressure regulator valve 88 for low pressure, a switching valve 89 for switching pressure, and a pneumatic pressure source 90, and can generate pressure pulsations having an amplitude of 0 to 1 MPa and a frequency of 0 to 10 Hz. The reference numerals P1, P2 denote pressure gauges.

In the electroless plating apparatus thus constructed, when a substrate W is plated, the plating substrate W is held in a predetermined position on the upper surface of the turntable 72 positioned below the plating cell 92. In this state, the turntable 72 is moved upwardly via the ball screw 85 by the motor 86 to thus bring the upper surface of the plating substrate W into close contact with the seal packing 91, thereby closing the lower opening of the plating cell 92 to form a hermetically sealed space therein. At this time, the supply valve 79 is opened to supply the plating liquid Q in the preparation bath 74 to the plating cell 92.

The interior of the plating cell 92 has a volume sufficient for accommodating the minimum amount of plating liquid Q required for performing a predetermined plating on the surface of the plating substrate W, and this minimum required amount of plating liquid Q is accommodated in the interior of the plating cell 92. Here, the minimum required amount of electroless plating liquid is set within a range of amount of liquid that includes ions of solutes 1.5 to 20 times as many as a predetermined deposited metal equivalent. In the plating process, the pressure pulsation generator 94 applies a pressure pulsation to the plating cell 92 via the pressure supply valve 78 at a predetermined amplitude and a predetermined frequency.

Figure 11A:
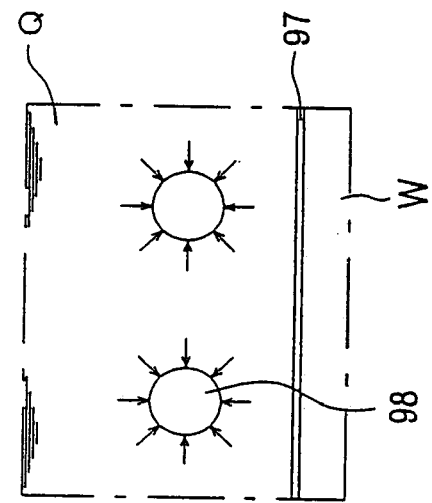
FIGS. 11A through 11C are schematic diagrams explanatory of the behavior of hydrogen gas bubbles when pressure of a hermetically sealed space in the electroless plating device is pulsed.
Figure 11B:
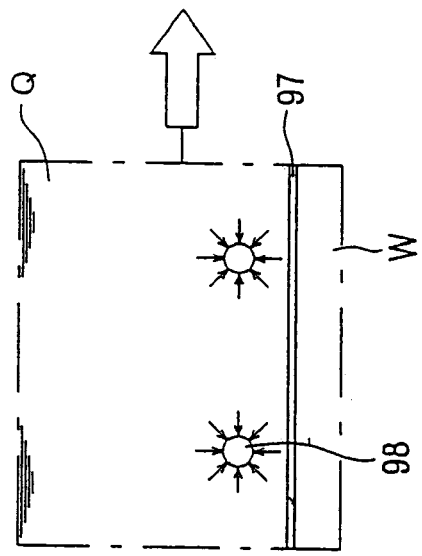
Figure 11C:
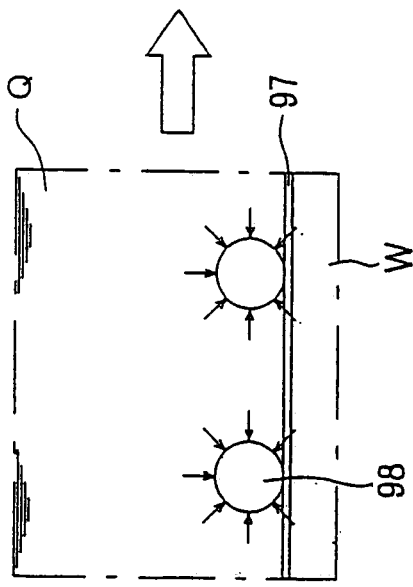

As shown in FIGS. 11A through 11C, since the plating substrate W is held on the upper surface of the turntable 72 in such a state that the surface to be plated faces upwardly, hydrogen gas bubbles 98 certainly generated in the plating liquid Q in the electroless plating process are moved upwardly due to buoyancy. Therefore, the number and the amount of bubbles remaining on the plating surface 97 of the plating substrate W and in fine grooves and holes are reduced, for thereby reducing the plating defects. Further, the minimum required amount of plating liquid Q is supplied to the hermetically sealed space in the plating cell 92, and the substrate is plated in a stationary state. Hence, the hydrogen gas bubbles 98 are not moved on the plating surface 97, thereby minimizing the amount of unevenly plated portions generated on the plating surface.

The pressure of the hermetically sealed space in the plating cell 92 is set to be higher than atmospheric pressure and pulsed by the pressure pulsation generator 94. Hence, as described above, the hydrogen gas bubbles 98 can be encouraged to dissolve into the electroless plating liquid Q by pressurization and simultaneously encouraged to separate from the plating surface 97 by pressure pulsation, as shown in FIGS. 11A through 11C.

The preparation bath 74 is disposed in the vicinity of the upper portion of the plating cell 92, and the minimum required amount of plating liquid prepared in the preparation bath 74 is supplied to the plating cell 92 just before the substrate W is plated. Hence, the plating process is completed before the occurrence of problematic reactions specific to the electroless copper plating, such as a Cannizzaro reaction or a disproportionation, which cause deterioration of the plating liquid and changes in concentration of the plating liquid composition after the preparation. Therefore, the plating process can be performed with a highly stable quality.

The plating liquid Q used for plating is discharged from the plating cell 92 via the plating discharge valve 80 into the waste liquid tank 93, where the plating liquid Q is processed as a waste liquid. Hence, the plating process can be performed with a highly stable quality. In addition, since the amount of plating liquid used per deposition is maintained to be the minimum required amount, it is possible to avoid increases in cost with the waste liquid and an excessive burden on the environment. Further, since the hot bath 75 is disposed above the plating cell 92 and the heater 73 for maintaining temperature is disposed below the turntable 72, it is possible to maintain a fixed plating temperature, which is one of the most important factors governing the quality uniformity of layer thickness, reproducibility, electric conductivity of the plating layer, etc.) of electroless plating.

Figure 12:
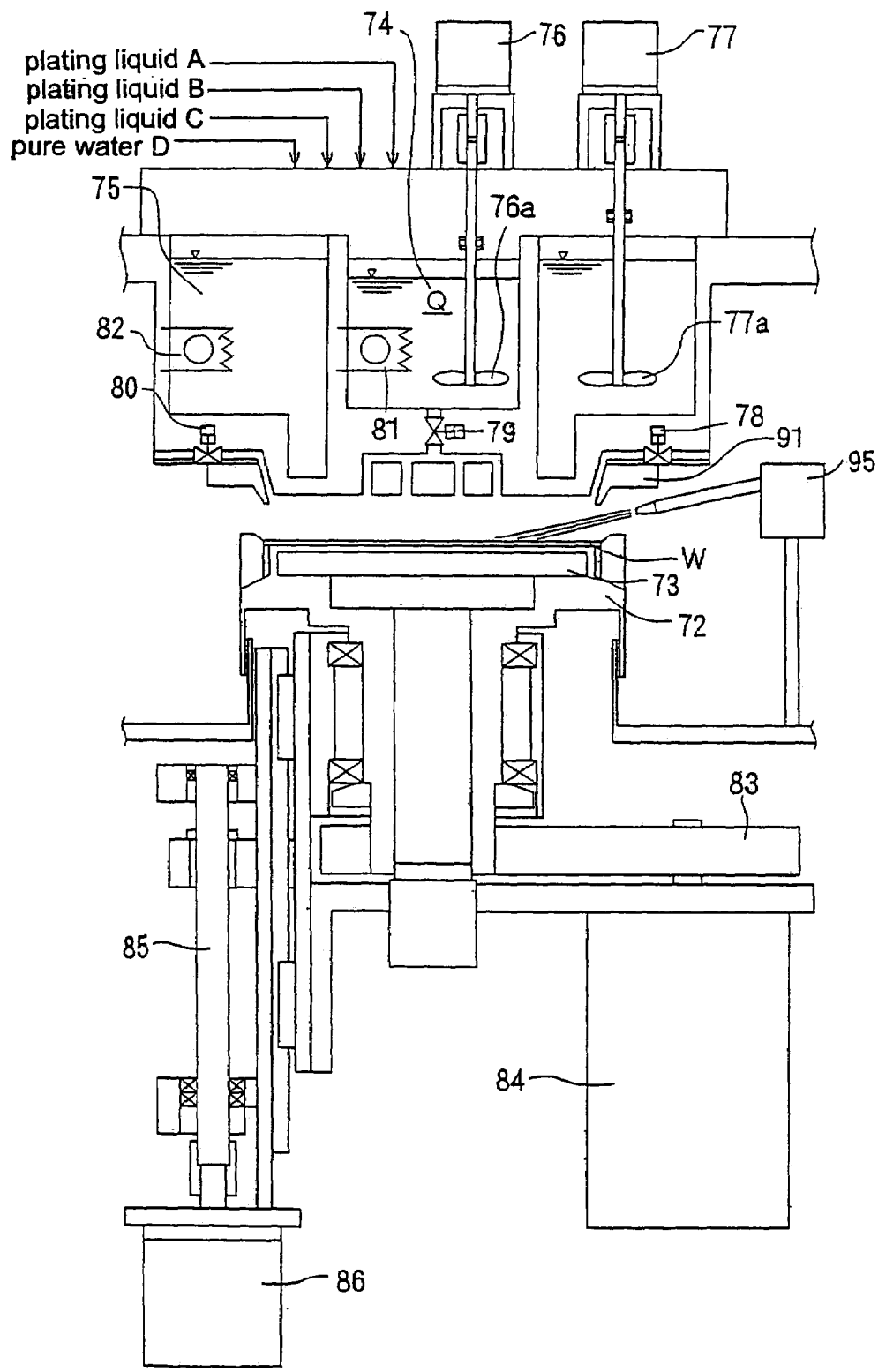
FIG. 12 is a schematic view showing a structure of the electroless plating device in FIG. 9.

After the plating process is completed, as described above, the plating liquid discharge valve 80 is opened to discharge the plating liquid in the plating cell 92 to the waste liquid tank 93. The turntable is moved downwardly via the ball screw 85 by the motor 86, and a cleaning liquid (mainly pure water) is ejected from a cleaning nozzle 95 shown in FIG. 12 to the plating surface of the plating substrate W to clean the plating surface. In this cleaning process, a cleaning nozzle 95 is swung, and the plating substrate W is slowly rotated via the timing belt 83 by the motor 84. After the cleaning process is completed, the plating substrate W is rotated at a high speed to spin off the cleaning liquid attached to the plating substrate X by centrifugal force.

After a seed layer is formed on the barrier layer in the wiring grooves by the electroless plating process, the substrate W is transferred to the first spin drying unit 70A by the transfer robot 61 and completely dried therein. Then, the substrate W is transferred to the electrolytic plating unit 71, where the electrolytic plating process is performed. The electrolytic plating process will be described below with reference to FIGS. 13 and 14.

Figure 13:
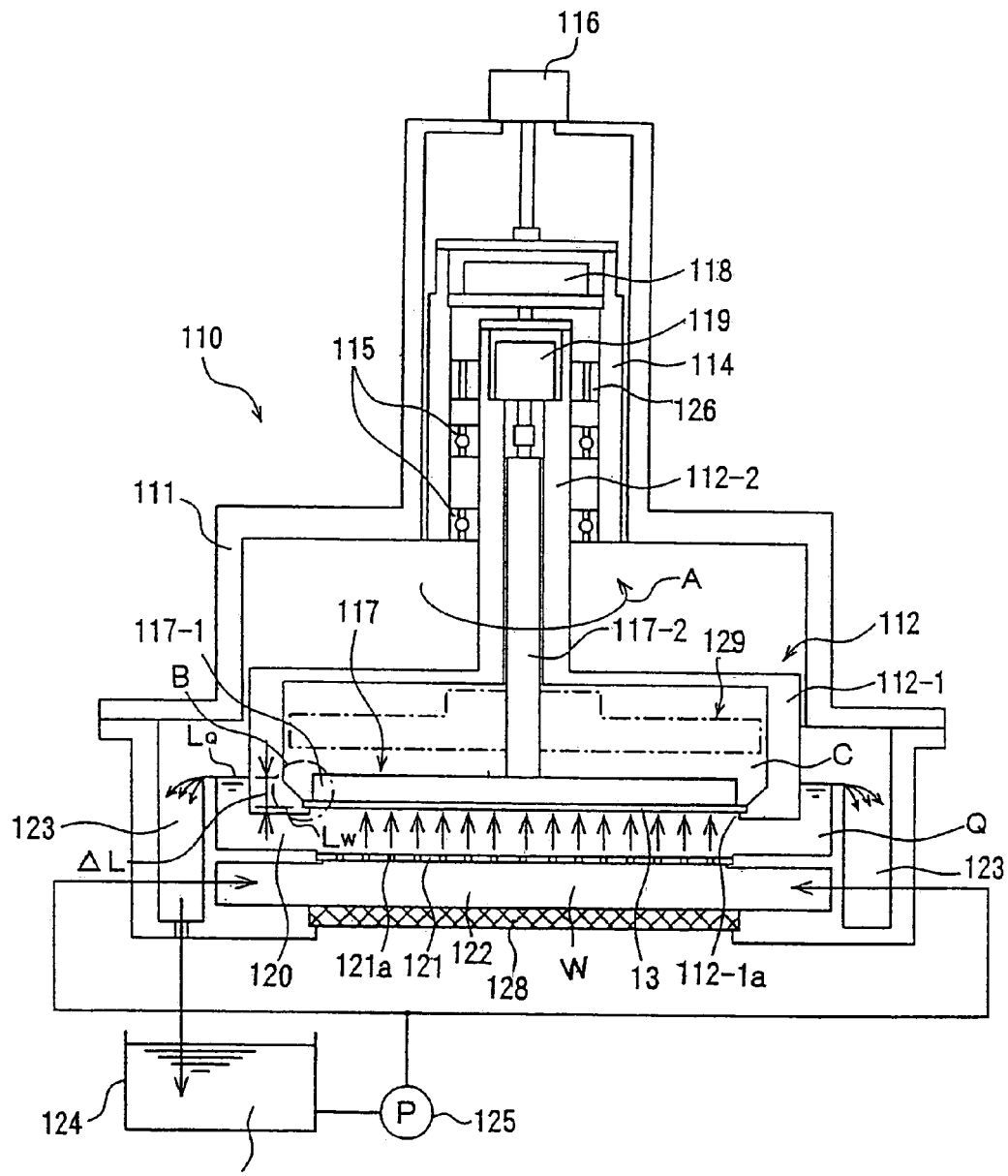
FIG. 13 is a schematic view showing a structure of an electrolytic plating device in FIG. 9.

As shown in FIG. 13, the electrolytic plating unit 71 comprises a plating tank 110, and the plating tank 110 comprises a plating tank body 111 and a substrate holding member 112 for holding a plating substrate W such as a semiconductor substrate in the plating tank body 111. The substrate holding member 112 has a substrate holding portion 112-1 and a shaft portion 112-2, and the shaft portion 112-2 is rotatably supported in an inner wall of a cylindrical guide member 114 via bearings 115, 115. The guide member 114 and the substrate holding member 112 are vertically movable at a predetermined stroke by a cylinder 116 provided on the top of the plating tank body 111.

The substrate holding member 112 is rotated in a direction indicated by the arrow A via the shaft portion 112-2 by a motor 118 provided on the inner side of the upper portion of the guide member 114. A space C is formed in the substrate holding member 112, and a substrate presser member 1117 having a substrate presser portion 117-1 and a shaft portion 117-2 is accommodated in the space C. The substrate presser member 117 is vertically movable at a predetermined stroke by a cylinder 119 provided on the top of the shaft portion 112-2 in the substrate holding member 112.

Figure 14:
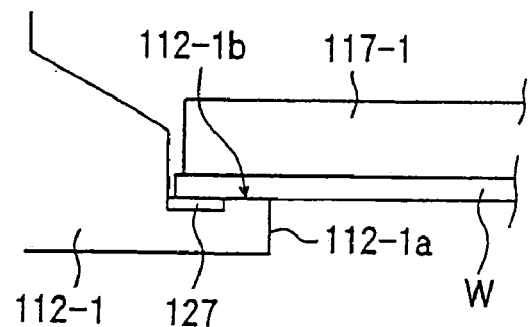
FIG. 14 is an enlarged view of an area B indicated in FIG. 13.

An opening 112-1a communicating with the space C is formed below the substrate holding portion 112-1 of the substrate holding member 112, and, as shown in FIG. 14, a step portion 112-1b on which the peripheral portion of the plating substrate W is placed is formed at the upper portion of the opening 112-1a. The peripheral portion of the plating substrate W is placed on the step portion 112-1b, and the upper surface of the plating substrate W is pressed by the substrate presser portion 117-1 of the substrate presser member 117, for thereby clamping the peripheral portion of the plating substrate W between the substrate presser portion 117-1 and the step portion 112-1b. The lower surface (plating surface) of the plating substrate W is exposed to the opening 112-1a, FIG. 14 is an enlarged view of the area B indicated in FIG. 13.

A flat plating liquid chamber 120 is provided below the substrate holding portion 112-1 of the plating tank body 111, i.e., below the plating surface of the plating substrate W exposed to the opening 112-1a, and a flat plating liquid introduction chamber 122 is provided below the plating liquid chamber 120 via a perforated plate 121 having a large number of holes 121a. The recovery gutter 123 for recovering a plating liquid Q overflowing the plating liquid chamber 120 is provided outside of the plating liquid chamber 120.

The plating liquid Q recovered in the recovery gutter 123 is returned to a plating liquid tank 124. The plating liquid Q in the plating liquid tank 124 is horizontally introduced to the plating liquid chamber 120 from both sides thereof by a pump 125. The plating liquid Q introduced to the plating liquid chamber 120 from both sides thereof flows vertically into the plating liquid chamber 120 through the holes 121a formed in the perforated plate 121. A distance between the perforated plate 121 and the plating substrate W is set to be 5 to 15 mm. The flow of the plating liquid Q passed through the holes 121a formed in the perforated plate 121 is brought into contact with the plating surface of the plating substrate W in such a state that the plating liquid Q flows upwardly as a uniform flow. The plating liquid Q overflowing the plating liquid chamber 120 is recovered in the recovery gutter 123 and flows into the plating liquid tank 124. Specifically, the plating liquid Q is circulated between the plating liquid chamber 120 in the plating tank body 111 and the plating liquid tank 124.

The plating liquid level $L_Q$ in the plating liquid chamber 120 is higher than the plating surface level $L_W$ of the plating substrate W by a slight distance $\Delta L$, and the plating liquid Q is brought into contact with the whole surface of the plating substrate W.

An electrical contact 127 for electrically connecting with a connecting portion of the plating substrate W is provided in the step portion 112-1b of the substrate holding portion 112-1 in the substrate holding member 112. The electrical contact 127 is connected to a cathode of an external plating power supply (not shown) via a brush 126. An anode 128 is provided on the bottom of the plating liquid introduction chamber 122 in the plating tank body 111, in confrontation with the plating substrate W. The anode 12B is connected to an anode of the plating power supply. A transfer slit 129 for inserting and removing the plating substrate W with a substrate transfer jig such as a robot arm is formed at a predetermined position in the wall of the plating tank body 111.

When the plating process is performed in the electrolytic plating unit thus constructed, the substrate holding member 112 is moved upwardly to a predetermined position (a position at which the plating substrate W held by substrate holding portion 112-1 opposes the transfer slit 129) together with the guide member 114 by actuating the cylinder 116, and simultaneously the substrate presser member 117 is moved upwardly to a predetermined position (a position at which the substrate presser portion 117-1 reaches the upper portion of the transfer slit 129) by actuating the cylinder 119. In this state, the plating substrate W is transferred to the space C in the substrate holding member 112 by the substrate transfer jig such as a robot arm and placed on the step portion 112-1b in such a state that the plating surface of the plating substrate W faces downwardly. At this state, the substrate presser portion 117-1 is moved downwardly to a position at which the lower surface of the substrate presser portion 117-1 is brought into contact with the upper surface of the plating substrate W, by actuating the cylinder 119, and hence the peripheral portion of the plating substrate W is clamped between the substrate presser portion 117-1 and the step portion 112-1b.

In this state, the substrate holding member 112 is moved downwardly to a position at which the plating surface of the plating substrate W is brought into contact with the plating liquid Q in the plating liquid chamber 120 (a position $\Delta L$ lower than the plating liquid level $L_Q$) together with the guide member 114 by actuating the cylinder 116. While the substrate holding member 112 is being moved downwardly, the substrate holding member 112 and the plating substrate W are rotated at a low speed by actuating the motor 118. The plating liquid chamber 120 is filled with the plating liquid Q, and the plating liquid passed through the holes 121a formed in the perforated plate flows vertically upwardly in the plating liquid chamber 120. In this state, when a predetermined voltage is applied between the anode 128 and the electric contact 127 by the plating power supply, a plating current flows from the anode 128 to the plating substrate W to form the plating layer on the plating surface of the plating substrate W.

During the plating process, the substrate holding member 112 and the plating substrate W are rotated at a low speed by actuating the motor 118. This rotation at a low speed is set such that the vertical flow of the plating liquid Q in the plating liquid chamber 120 is not interrupted, and a plating layer having a uniform thickness can be formed on the plating surface of the plating substrate W.

When the plating process is completed, the substrate holding member 112 and the plating substrate W are moved upwardly by actuating the cylinder 116. When the lower surface of the substrate holding portion 112-1 is positioned above the plating liquid level $L_Q$, the motor 118 rotates the substrate holding member 112 and the plating substrate W at a high speed to spin off the plating liquid attached on the plating surface of the plating substrate W and the lower surface of the substrate holding portion 1121. After the plating liquid is spun off, the plating substrate W is moved upwardly to a position corresponding to the transfer slit 129. When the substrate presser portion 117-1 is moved upwardly by actuating the cylinder 119, the plating substrate W is released from the substrate presser portion 117-1 in such a state that the plating substrate W is placed on the step portion 112-1b of the substrate holding portion 112-1. In this state, the substrate transfer jig such as a robot arm is inserted from the transfer slit 129 into the space C in the substrate holding member 112 to pick up the plating substrate W and transfer it to the exterior.

With the electrolytic plating unit 71 thus constructed, a plating substrate N in which holes having a diameter of 0.15 μm and a depth of 1.2 μm were formed was plated by the electrolytic plating process to fill the holes with copper. A plating liquid Q having the following composition, a current density of 2 A/dm$^2$, and a temperature of 25° C. was used, and a plating time was set to 150 seconds. The holes were efficiently filled with copper.

Composition of Plating Liquid Q

| | |
|---|---|
| CuSO$_4$.5H$_2$O | 225 g/l |
| H$_2$SO$_4$ | 55 g/l |
| Cl$^-$ | 60 mg/l |
| Sulfur compound (N,N-dimethyldithiocarbamylpropyl-sulfonic acid) | 5 mg/l |
| Macromolecular compound (PEG6000) | 0.1 g/l |
| Nitrogen compound (safranine compound, janus green B) | 2 mg/l |

When a plating liquid having a high concentration of copper sulfate (CuSO$_4$.5H$_2$O) is used, as described above, a hole having a diameter of 0.15 μm and a depth of 1.2 μm can efficiently be filled with copper by plating.

Figure 15:
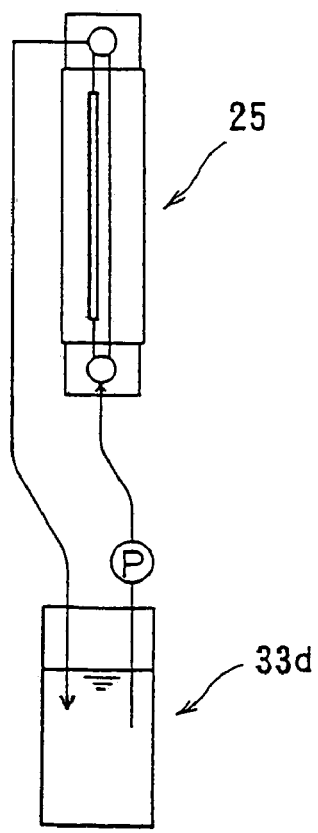
FIG. 15 is a schematic view showing a processing tank used in the plating apparatus and circulating paths of a processing liquid according to the third embodiment of the present invention.
Figure 16A:
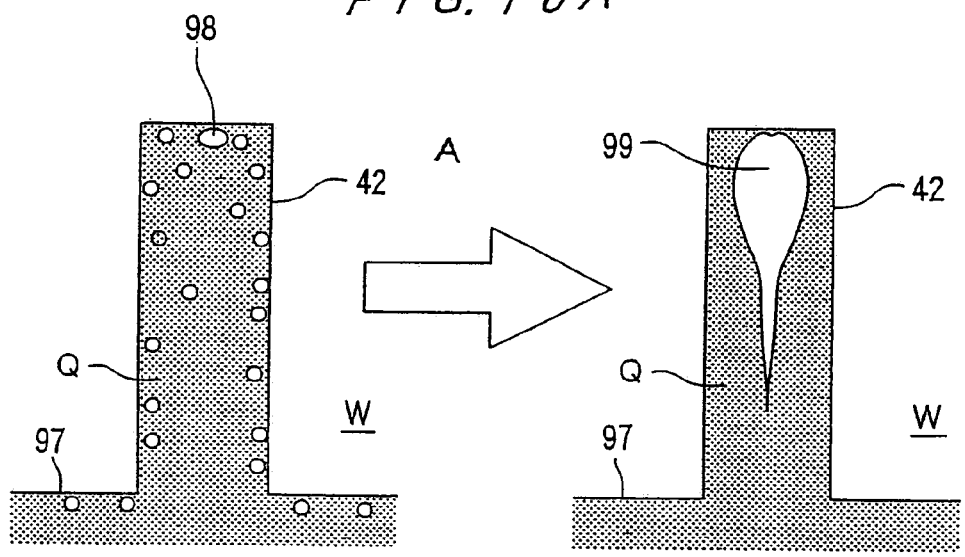
FIGS. 16A and 16B are schematic diagrams explanatory of the behavior of hydrogen gas bubbles in electroless plating.
Figure 16B:
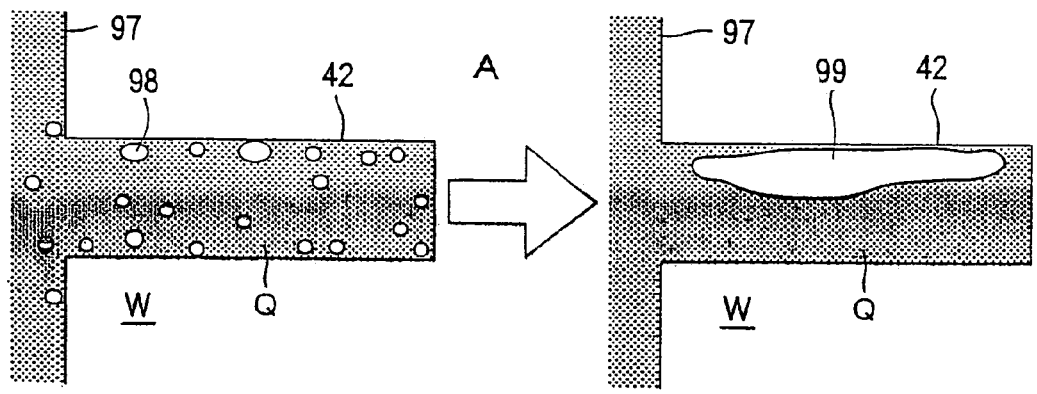
Figure 18:
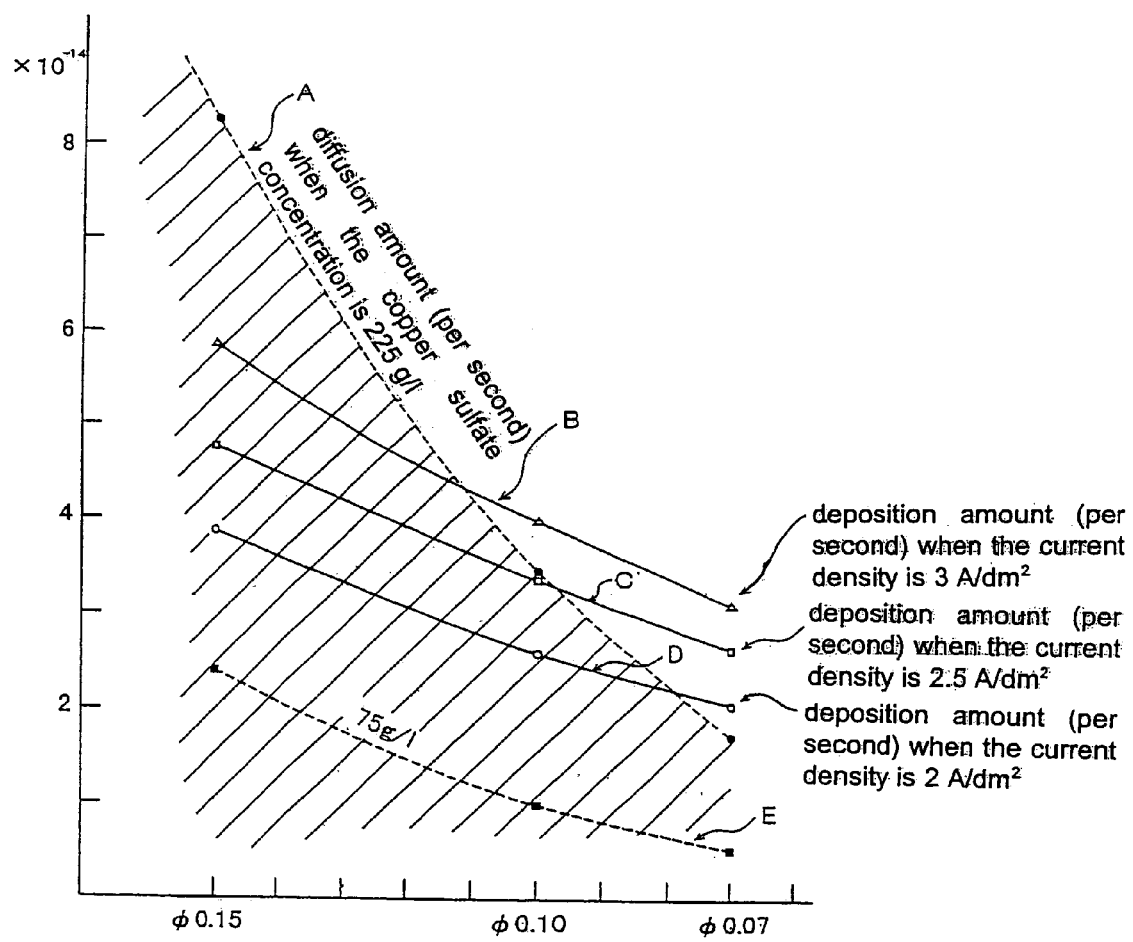
FIG. 18 is a graph comparing diffusion amount and deposition amount in holes formed in a plating substrate.

FIG. 15 shows a processing tank 25 which can continuously perform an electroless plating process and an electrolytic plating process with the same processing liquid. The processing tank 25 can perform an electrolytic plating process as with the processing tank shown in FIG. 8. In this processing tank, the electroless plating process is performed, and then the electrolytic plating process is directly performed by energization of a low current of less than 0.2 A/dm$^2$. In this case, an electroless plating liquid is used as a plating liquid, and TMAH is used in place of NaOH or KOH usually used as a pH regulator in the electroless plating process, in order to prevent the semiconductor substrate from being contaminated. TMAH is an organic alkali chemical including a methyl group. It is necessary to avoid using a reducing agent liable to be decomposed, such as formalin, which has commonly been used.

Conventionally, in the through hole plating of the printed circuit board, throwing power has been improved by a high throwing power bath (CuSO$_4$.5H$_2$O 10–80 g/l) having a low Cu concentration. However, when trenches and via holes of a semiconductor substrate are plated, not only throwing power but also leveling of plating is required in order to prevent the generation of voids. Further, since the high throwing power bath is easily influenced by the flow of a plating liquid, it is desirable to use a plating liquid having a mid to high increased concentration for reducing the possibility of flow effects.

Various things were examined under the above preconditions. As a result, conventionally used baths such as a $CuSO_4 \cdot 5H_2O$ low concentration (15–80 g/l) bath (high throwing power bath) superior in throwing power, or a $CuSO_4 \cdot 5H_2O$ high concentration (150–220 g/l) bath (decorative bath) superior in leveling of plating were found not to be appropriate. A $CuSO_4 \cdot 5H_2O$ mid concentration (100–150 g/l) bath was found to be appropriate for a damascene plating process which combines an electroless plating process and an electrolytic plating process of a semiconductor substrate.

As described above, according to the present invention, an initial plating layer (seed layer) is formed with an electroless plating process, and then the recess in the substrate is filled with electrolytic plating metal while the initial layer serves as the feeding layer. Accordingly, the recess having a barrier layer of a high electrical resistance can efficiently be filled with a void-free wiring metal, without the sputtering process or the CVD process in a series of plating processes. Therefore, the present invention can provide a method and apparatus for plating a substrate to form wiring by efficiently filling a fine recess formed in a semiconductor substrate with plating metal without a void or contamination.

INDUSTRIAL APPLICABILITY

The present invention is suitable for a method and apparatus for plating a substrate to fill a wiring recess formed in a semiconductor substrate with wiring metal such as copper, copper alloy, or the like.

What is claimed is:

1. An apparatus for plating a surface of a substrate to fill a wiring recess in the surface with a metal, said apparatus comprising:
   a frame;
   a load/unload unit on which the substrate is held;
   a transfer mechanism disposed in said frame; and
   a plurality of processing units disposed in said frame so as to surround said transfer mechanism, said processing units including:
   an electroless plating unit for performing an electroless plating process to form an initial layer on the substrate; and
   an electrolytic plating unit for performing an electrolytic plating process to fill the wiring recess with the metal while the initial layer serves as a feeding layer,
   wherein said electroless plating unit includes:
      a seal packing to be brought into contact with the substrate;
      a plating cell for forming a hermetically sealed space with the substrate and said seal packing, the hermetically sealed space having a volume sufficient for receiving a minimum amount of an electroless plating liquid required for the electroless plating process; and
      a turntable for holding the substrate so that the substrate is cleaned and dried after the electroless plating process.

2. An apparatus according to claim 1, wherein said transfer mechanism is linearly movable.

3. An apparatus according to claim 1, wherein said processing units also include a cleaning and drying device for cleaning and spin drying the substrate after the electrolytic plating process.

4. An apparatus according to claim 1, wherein said processing units also include a pretreatment unit for performing a pre-treatment process of the electroless plating process.

5. An apparatus according to claim 1, wherein said electrolytic plating unit comprises an electrolytic plating bath having a plating liquid comprising copper sulfate ($CuSO_4 \cdot 5H_2O$) having a concentration of 100 to 250 g/l.

6. An apparatus according to claim 1, wherein said electrolytic plating unit comprises an electrolytic plating bath having a plating liquid comprising sulfuric acid ($H_2SO_4$) having a concentration of 10 to 100 g/l.

7. An apparatus according to claim 1, wherein said electrolytic plating unit comprises an electrolytic plating bath having a plating liquid comprising chlorine ions having a concentration of 0 to 100 mg/l.

8. An apparatus according to claim 1, wherein said electrolytic plating unit comprises an electrolytic plating bath having a plating liquid comprising at least 0.14 to 70 µmol/l of a sulfur compound expressed by a formula

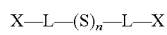

where L is an alkyl group having a carbon number of 1 to 6 which is substituted by a lower alkyl group, a lower alkoxyl group, a hydroxyl group, or a halogen atom; n is an integer; and X is a hydrogen atom, a $—SO_3M$ group, or a $—PO_3M$ group; and M indicates a hydrogen atom, an alkali metal atom, or an amino group.

9. An apparatus according to claim 1, wherein said electrolytic plating unit comprises an electrolytic plating bath having a plating liquid comprising at least 10 to 5000 mg/l of a macromolecular compound expressed in a formula

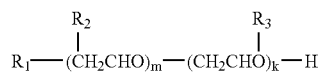

where $R_1$ indicates a residue of a higher alcohol group having a carbon number of 8 to 25, a residue of an alkyl phenol with an alkyl group having a carbon number of 1 to 25, a residue of an alkyl naphthol with an alkyl group having a carbon number of 1 to 25, a residue of a fatty acid amide having a carbon number of 3 to 22, a residue of an alkylamine having a carbon number of 2 to 4, or a hydroxyl group; $R_2$ and $R_3$ indicate a hydrogen atom or a methyl group; and m and k indicate an integer from 1 to 100.

10. An apparatus according to claim 1, wherein said electrolytic plating unit comprises an electrolytic plating bath having a plating liquid comprising at least 0.01 to 100 mg/l of a nitrogen compound.

11. An apparatus according to claim 1, wherein said frame is rectangular in shape.

12. An apparatus according to claim 1, wherein said electroless plating unit also includes a waste liquid tank for receiving the electroless plating liquid that has been used for the electroless plating process, without circulating the electroless plating liquid.

13. An apparatus according to claim 1, wherein said electroless plating unit further includes a cleaning nozzle for ejecting a cleaning liquid to a surface of the substrate to clean the substrate after the electroless plating process.

14. An apparatus according to claim 1, wherein said turntable is configured to be rotated at a high rate of speed to dry the substrate after the electroless plating process.

* * * * *

UNITED STATES PATENT AND TRADEMARK OFFICE
CERTIFICATE OF CORRECTION

PATENT NO.       : 7,033,463 B1                                            Page 1 of 1
APPLICATION NO.  : 09/762582
DATED            : April 25, 2006
INVENTOR(S)      : Akihisa Hongo et al.

It is certified that error appears in the above-identified patent and that said Letters Patent is hereby corrected as shown below:

On the Title Page
Item (45) Date of the Patent:, add an asterisk (*) next to the date to indicate that patent is subject to a terminal disclaimer.

On the title page item (*) after the Notice: section, insert the following:

This patent is subject to a terminal disclaimer.

Signed and Sealed this

Twenty-second Day of August, 2006

JON W. DUDAS
*Director of the United States Patent and Trademark Office*